(12) United States Patent
Bonebright et al.

(10) Patent No.: US 9,543,915 B1
(45) Date of Patent: Jan. 10, 2017

(54) STACKED ACTIVE RF CIRCUITS INCLUDING IN-SITU BIAS MONITORING SYSTEMS AND METHODS

(71) Applicant: The Boeing Company, Chicago, IL (US)

(72) Inventors: Rodney K. Bonebright, Bellevue, WA (US); Jacob C. Killens, Auburn, WA (US); Mark W. Steeds, Auburn, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/835,649

(22) Filed: Aug. 25, 2015

(51) Int. Cl.
| | | |
|---|---|---|
| H04B 1/04 | (2006.01) | |
| H03F 3/68 | (2006.01) | |
| H03F 3/195 | (2006.01) | |

(52) U.S. Cl.
CPC ............... *H03F 3/68* (2013.01); *H03F 3/195* (2013.01); *H04B 1/0475* (2013.01); *H03F 2200/451* (2013.01); *H04B 2001/0408* (2013.01)

(58) Field of Classification Search
CPC ............ H03G 9/26; H03G 9/30; H03F 3/211; H03F 2200/451; H03F 2200/429; H03F 3/195
USPC .................... 455/127.3, 253.2, 341; 330/279
See application file for complete search history.

(56) References Cited

U.S. PATENT DOCUMENTS

| | | | |
|---|---|---|---|
| 4,885,798 A * | 12/1989 | Jinich | H04W 52/52 455/127.3 |
| 6,424,313 B1 | 7/2002 | Navarro et al. | |
| 7,149,483 B1 | 12/2006 | Reinisch et al. | |
| 7,453,147 B2 * | 11/2008 | Ida | H01L 23/13 257/723 |
| 7,510,941 B2 * | 3/2009 | Hatori | H01L 21/823425 257/E21.427 |
| 7,876,156 B2 * | 1/2011 | Tanaka | H03F 1/0261 330/279 |
| 8,076,974 B2 * | 12/2011 | Tanaka | H03F 1/0261 330/279 |
| 2006/0164284 A1 | 7/2006 | Pauplis et al. | |

(Continued)

OTHER PUBLICATIONS

U.S. Appl. No. 14/827,941, The Boeing Company.
U.S. Appl. No. 14/835,634, Bonebright et al.
U.S. Appl. No. 14/835,617, Bonebright et al.

*Primary Examiner* — Sonny Trinh

(74) *Attorney, Agent, or Firm* — Haynes and Boone, LLP

(57) ABSTRACT

Systems and methods according to one or more embodiments are provided for stacked active RF circuits implemented as amplification stages in high gain phased array antenna systems. Stacked active RF circuits may be implemented, for example, as an amplification stage of an element electronic circuit. Stacked active RF circuits may be implemented, for example, as a second amplification stage to maintain amplification in a high gain phased array antenna system. In one example, a system comprises a substrate comprising a plurality of substrate layers and one or more input ports and output ports. A plurality of amplification stages comprising a plurality of amplifiers, attenuators, and phase shifters are integrated within the plurality of substrate layers, the amplification stage coupled between the input and output ports. One or more monitor circuits are coupled to the plurality of amplification stages. Additional systems and methods are also provided.

18 Claims, 22 Drawing Sheets

(56) References Cited

U.S. PATENT DOCUMENTS

2014/0002186 A1  1/2014  Kawasaki
2015/0163044 A1  6/2015  Analui et al.

\* cited by examiner

STACKED ACTIVE RF CIRCUITS INCLUDING IN-SITU BIAS MONITORING SYSTEMS AND METHODS

STATEMENT REGARDING FEDERALLY SPONSORED RESEARCH OR DEVELOPMENT

This invention was made with Government support under contract number S0002-EMTC-BOEING awarded by ACI Mantech. The Government has certain rights in this invention.

TECHNICAL FIELD

The invention relates generally to phased array antennas and, more particularly, for example, to stacked active RF circuits in compact high gain phased array antenna systems.

BACKGROUND

In the field of high gain phased array antennas such as for modern broadband mobile systems, there is an ongoing effort to reduce the size of element and non-element electronics functions while still maintaining key antenna performance parameters. Thus, there is a need for integrated module solutions that may provide performance or other advantages over conventional phased array antenna subsystems.

SUMMARY

Systems and methods are disclosed herein in accordance with one or more embodiments that provide an improved approach to stacking active RF circuits used as front end electronics in a compact high gain phased array antenna system. In some embodiments, stacked active RF circuits are implemented as amplification stages. In one example, stacked active RF circuits are implemented in an amplification stage of an element electronic circuit. In another example, stacked active RF circuits are implemented in an amplification stage of a non-element electronic circuit. In some embodiments, stacked active RF circuits may be implemented on a sixty-four element sub-array tile assembly including thirty-two dual element circuit die.

In one embodiment, a system includes a substrate comprising a plurality of substrate layers; one or more input ports and output ports; a plurality of amplification stages comprising a plurality of amplifiers, attenuators, and phase shifters integrated within the plurality of substrate layers, the amplification stage coupled between the input and output ports; and one or more monitor circuits coupled to the plurality of amplification stages.

In another embodiment, a method includes ordering a plurality of amplification stages within a plurality of substrate layers; selecting an operating bias for a plurality of amplifiers within a corresponding one of the plurality of amplification stages; partitioning the plurality of amplifiers within the corresponding one of the plurality of amplification stages within the plurality of substrate layers; and monitoring the plurality of amplifiers within the corresponding one of the plurality of amplification stages direct current and DC voltage operating bias.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
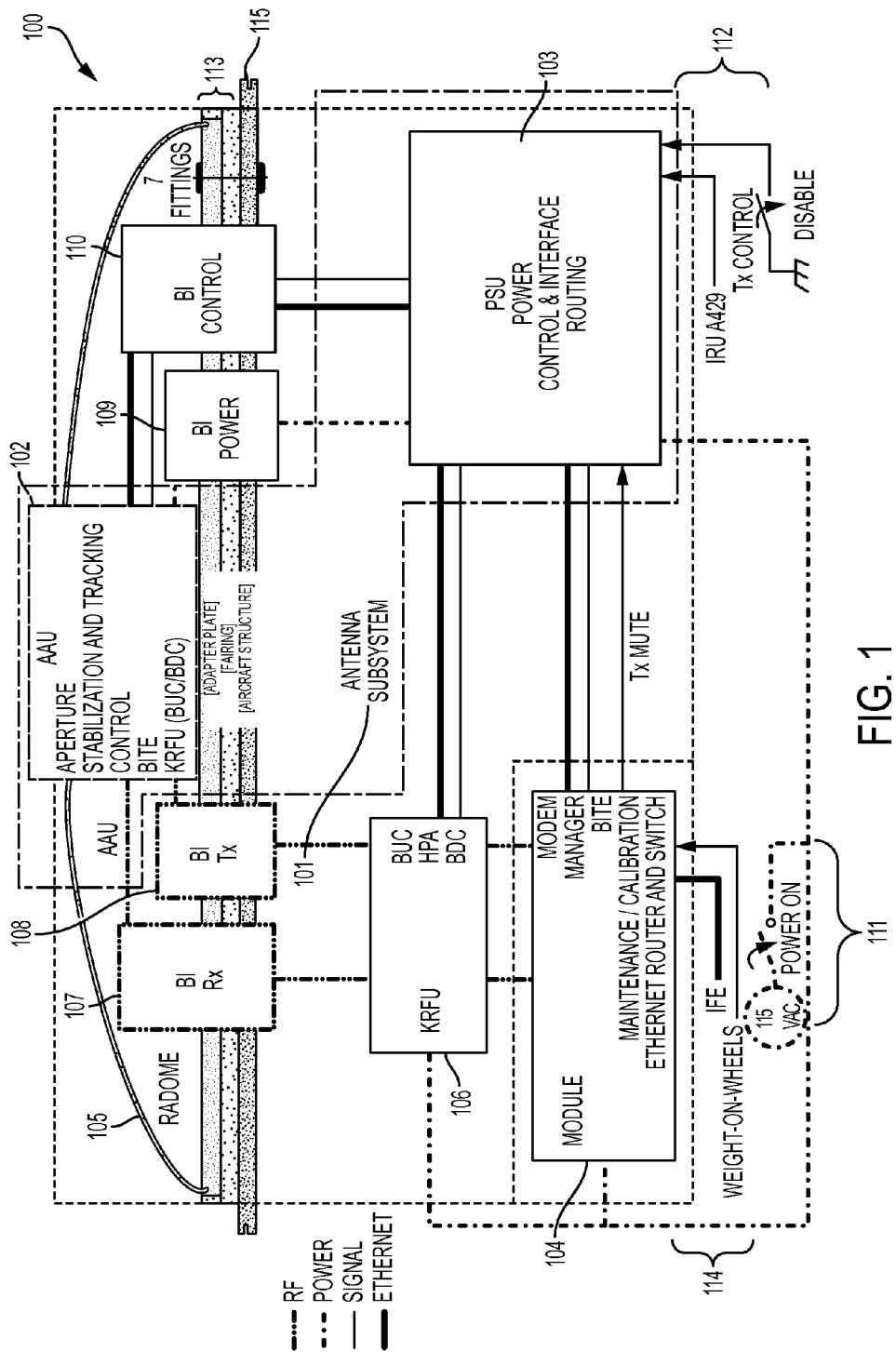
FIG. 1 illustrates a communications system in accordance with an embodiment of the disclosure.

Conventional antenna architectures may use high amplification modules to avoid system degradation resulting from lossy distribution networks. High amplification is typically made possible by the use of radio frequency (RF) cavities located within signal paths between modules electronics to reduce feedback which may degrade antenna performance. Low cost integrated module solutions may be prevented from using RF cavities because the electronics may not be constructed from multiple modules.

Further, conventional antenna design may utilize a power supply appropriate to the process. Conventional RF systems may design for low voltage, high direct current implementations. Most RF system designs may use multiple substrate and die materials resulting in multiple processes with multiple device breakdowns. This translates into systems with multiple power supplies that lead to increased complexity of the electronics and direct current (DC) supply distribution hardware.

As RF integrated circuit designs include more element electronics functionality within smaller die geometries, pad spacing sufficient for the increased number of input and output RF signal connections may be reduced. Further, coefficient of thermal expansion (CTE) issues within integrated circuit substrates may constrain pad spacing for reliable interconnections. Pad spacing constraints may limit achievable input-to-output isolation of RF signals. This limited isolation reduces the acceptable amplification in the element electronics due to feedback issues associated with high amplification in coupled circuits. An amplification limit degrades antenna performance unless the amplification can be supplemented prior to large losses associated with high frequency RF distribution networks.

Additionally, element spacing in a phased array antenna for most applications is one-half wavelength. In a broadband phased array antenna application, element summing delays need to be proportional to the delay over the length of the antenna. For example, an array arranged in a thirty-two by thirty-two matrix requires 16 wavelengths of delay for a full bandwidth antenna. Conventional methods of true time delay may use switched transmission lines integrated into a phased array structure to generate element summing delays. Delay lines may be arranged in a meandering pattern on the array lattice with a signal delay proportional to their length. As the desire for more compact element electronics grows, the space available for switched transmission lines diminishes.

Further, variable insertion loss of line segments may add to the complexity of combining the resultant coherent outputs giving rise to the need for additional amplification to compensate for such insertion loss variability.

Thus, there is a need for integrating multiple module elements and non-element electronics functionality into a single module while maintaining key antenna performance parameters.

As set forth above, these approaches fail to provide a high fidelity RF signal amplification required for modern compact high gain phased array broadband antennas. A stacked RF active circuit implementation is described herein that provides a footprint to fit within modern high gain phased array antenna size constraints and provides the necessary electrical and thermal characteristics for reliable high gain antenna performance.

FIG. 1 illustrates a communications system 100 in accordance with an embodiment of the disclosure. Communications system 100 may be used on a land or airborne based vehicle platform, such as an airplane, a satellite, a helicopter, or an unmanned aerial vehicle (UAV), for example. In FIG. 1, an antenna subsystem 101 is shown in context with communications system 100. Antenna subsystem 101 (e.g., phased array antenna subsystem) may include an antenna aperture unit (AAU) 102 and a power supply unit (PSU) 103. Power supply unit 103 may provide power control and interface routing functions to antenna aperture unit 102 among other functions not discussed herein. Antenna aperture unit 102 may include an aperture, stabilization and tracking control, built in test electronics (BITE), and K Band RF Unit (KRFU) Block up-converter (BUC)/Block down-converter (BDC) functions.

Communications system 100 may also include a module 104 coupled to PSU 103 via signal (e.g., Transmit (Tx) Mute signal) and Ethernet interfaces. Module 104 may be coupled to a KRFU 106 via one or more RF signal interfaces. Module unit 104 may be configured to include a modem manager, BITE, maintenance/calibration and Ethernet router and switch functions. A weight on wheels signal and In Flight Entertainment (IFE) Ethernet interface 114 may be coupled to module 104.

KRFU 106 may be configured to include BUC, High power amplifier (HPA) and BDC functions wherein KRFU may be further coupled to a Bulkhead Interface (BI) Rx 107 and a BI Tx 108 via one or more RF signal interfaces. Further, KRFU 106 may be coupled to PSU 103 via one or more Ethernet and signal interfaces. BI Rx 107 and BI Tx 108 may be coupled to AAU 102 via one or more RF signal interfaces.

An Inertial Reference Unit (IRU) Aeronautical Radio INC. 429 (A429) and Tx control disable switch interface 112 may be coupled to PSU 103. PSU 103 may also be coupled to a BI control 110 via one or more Ethernet and signal interfaces. BI control 110 may be further coupled to AAU 102 via one or more Ethernet and signal interfaces. One hundred fifteen VAC (e.g., volts AC) switch 111 may be coupled to a plurality of interfaces including PSU 103, a BI power 109, KRFU 106, and module 104 to provide switched one hundred fifteen VAC to powered units. BI power supply 109 may be coupled to AAU 102 to provide switched one hundred fifteen VAC.

A radome 105 may be connected to an interface 113 to provide a protective cover for communications system 100. Interface 113 may include an adapter plate coupled to radome 105 and a fairing coupled between adapter plate and an aircraft structure 115. Interface 113 may be connected to aircraft structure 115 via seven fittings.

FIG. 2 illustrates a phased array antenna subsystem 200 in accordance with an embodiment of the disclosure. In FIG. 2, antenna subsystem 101 (e.g., phased array antenna subsystem) may include antenna aperture unit (AAU) 102 and power supply unit (PSU) 103. Power supply unit 103 may provide an Ethernet interface to an antenna controller 209 of AAU 102. Power supply unit 103 may also provide a Tx disable discrete control signal and a High voltage direct current (HVDC) input signal to a power supply assembly 205 of AAU 102. Ethernet interface signals may be provided within a PSU 103 output connector 253. An AAU 102 input connector 275 may be coupled to PSU output connector 253 and configured to receive Ethernet interface signals at the antenna controller 209 as a 10/100Base-T network interface. The HVDC and Tx disable discrete control signals may be provided within a PSU 103 output connector 254. An AAU 102 input connector 276 may be coupled to PSU 103 output connector 254 and configured to receive the HVDC input and Tx disable discrete control signal at power supply assembly 205. DC Power may be routed from power supply assembly 205 to assemblies that form AAU 102. A control assembly 208 may include antenna controller 209. Antenna controller 209 may provide communication to assemblies that form AAU 102.

For example, antenna controller 209 may communicate with power supply assembly 205 via PS buses to provide control of power supply assembly 205 and receive status (e.g., telemetry). Antenna controller 209 may communicate with a receive array distribution assembly 220 via BDC bus and with a transmit array distribution assembly 229 via BUC bus. Antenna controller 209 may communicate with a sub-array tile controller 215 of a receive sub-array tile assembly 211 via RX Sub-array (SA) bus and with sub-array tile controller 215 of a transmit sub-array tile assembly 212 via TX SA bus. In this regard, antenna controller 209 may be a communication and control host for AAU 102.

In FIG. 2, antenna aperture unit 102 may include a receive signal path 210. As shown in FIGS. 2D and 2E, receive signal path 210 may include a receive aperture Wide angle impedance match (WAIM) assembly 207 including a plurality of aperture elements, a receive sub-array tile assembly 211 and receive array distribution assembly 220. In some embodiments, antenna aperture unit 102 includes one receive aperture WAIM assembly 207 including 64 antenna elements, forty-five receive sub-array tile assemblies 211 and one receive array distribution assembly 220.

Receive sub-array tile assembly 211 may include a plurality of aperture elements as part of receive aperture WAIM assembly 207, a plurality of receive element circuits 213, a plurality of sub-array combiner circuits 218a and 218b, sub-array tile controller 215, a plurality of distributed gain circuits 217 and a plurality of selectable signal delay circuits 216 as described herein. In some embodiments, receive sub-array tile assembly 211 includes sixty-four antenna elements, sixty-four receive element circuits 213 (e.g., thirty-two receive dual element circuit die 241), two sub-array combiner circuits 218a and 218b and two substrates 538 (see FIG. 5), each substrate including selectable signal delay circuit 216 (e.g., identified as TIME DELAY in FIG. 2D) and distributed gain circuit 217 (e.g., identified as KU RX AMP in FIG. 2D). It will be appreciated that receive sub-array tile assembly 211 includes physical space for two substrates 538 comprising four non-element functions (e.g., two selectable signal delay circuits 216 and two distributed gain circuits 217).

Distributed gain circuit 217 may provide an amplification of a combined thirty-two receive element output signals (e.g., thirty-two receive element circuit 213 output signals 226a or 226b combined by one of two corresponding sub-array combiner circuits 218a and 218b) to improve a noise figure and linearity as a combined RF signal (e.g., one of combined RF signals 331a and 331b shown in FIG. 3) travels through lossy distribution networks such as receive array distribution assembly 220. Selectable signal delay circuit 216 may provide a selectable delay to amplified combined RF signal to provide a coherent RF signal from up to approximately 2 feet of delay across an antenna array for broad bandwidth time control. In some embodiments, one of eight selectable time delays may be selected by a sub-array tile controller 215 switch control signal 230 coupled to selectable signal delay circuit 216. More or fewer selectable time delays may be possible in other embodiments.

A signal flow for receive signal path 210 may start at a first antenna element within receive aperture WAIM assembly 207. As shown in FIG. 2D, a radio frequency (RF) signal 221a (e.g., RF input 1) originating at the first antenna element may be received at an input port of receive element circuit 213. In some embodiments, RF signal 221a may be received as a differential signal at input port of receive element circuit 213. RF signal 221a may be phase shifted and amplified within receive element circuit 213 and provided at an output port. A plurality of receive element circuit output signals 226a may be accepted at a sub-array combiner circuit 218a input to combine the plurality of output signals 226a to form combined RF signal of sub-array combiner circuit 218a output. In some embodiments, sub-array combiner circuit 218a may be implemented as a 32:1 combiner wherein thirty-two RF signals corresponding to thirty-two receive dual element circuit die 241 output signals 226a may be combined.

Figure 7C:
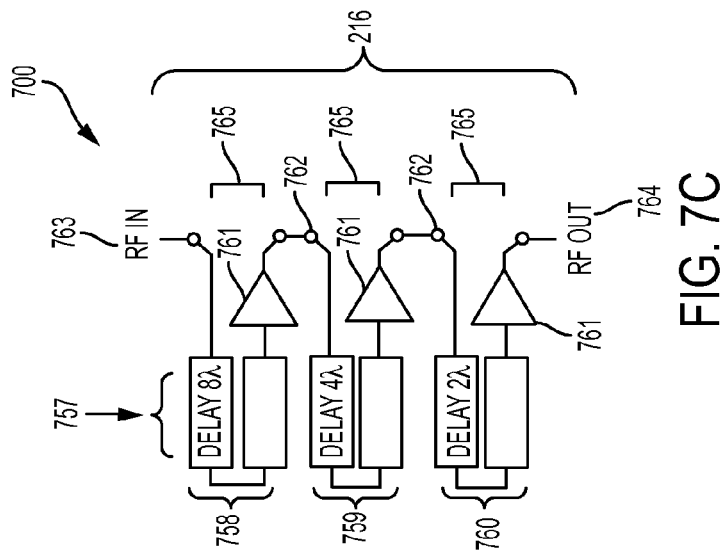
FIGS. 7A, 7B and 7C illustrate views of a true time delay function in accordance with embodiments of the disclosure.

The combined RF signal may be received at first distributed gain circuit 217 input port wherein first distributed gain circuit 217 may provide an amplification of the combined RF signal. Distributed gain circuit 217 output signal may be received at an input port of a first selectable signal delay circuit 216 to selectively time delay the amplified signal as discussed herein. Further, selectable signal delay circuit 216 may provide a selectable amplification of RF signal traveling from selectable signal delay circuit 216 input port to an output port as discussed further herein. RF signal traveling from selectable signal delay circuit 216 input port may be amplified to offset an insertion loss of RF signal as it travels through selectable signal delay circuit 216 to output port 764 (as shown in FIG. 7C).

Figure 2A:
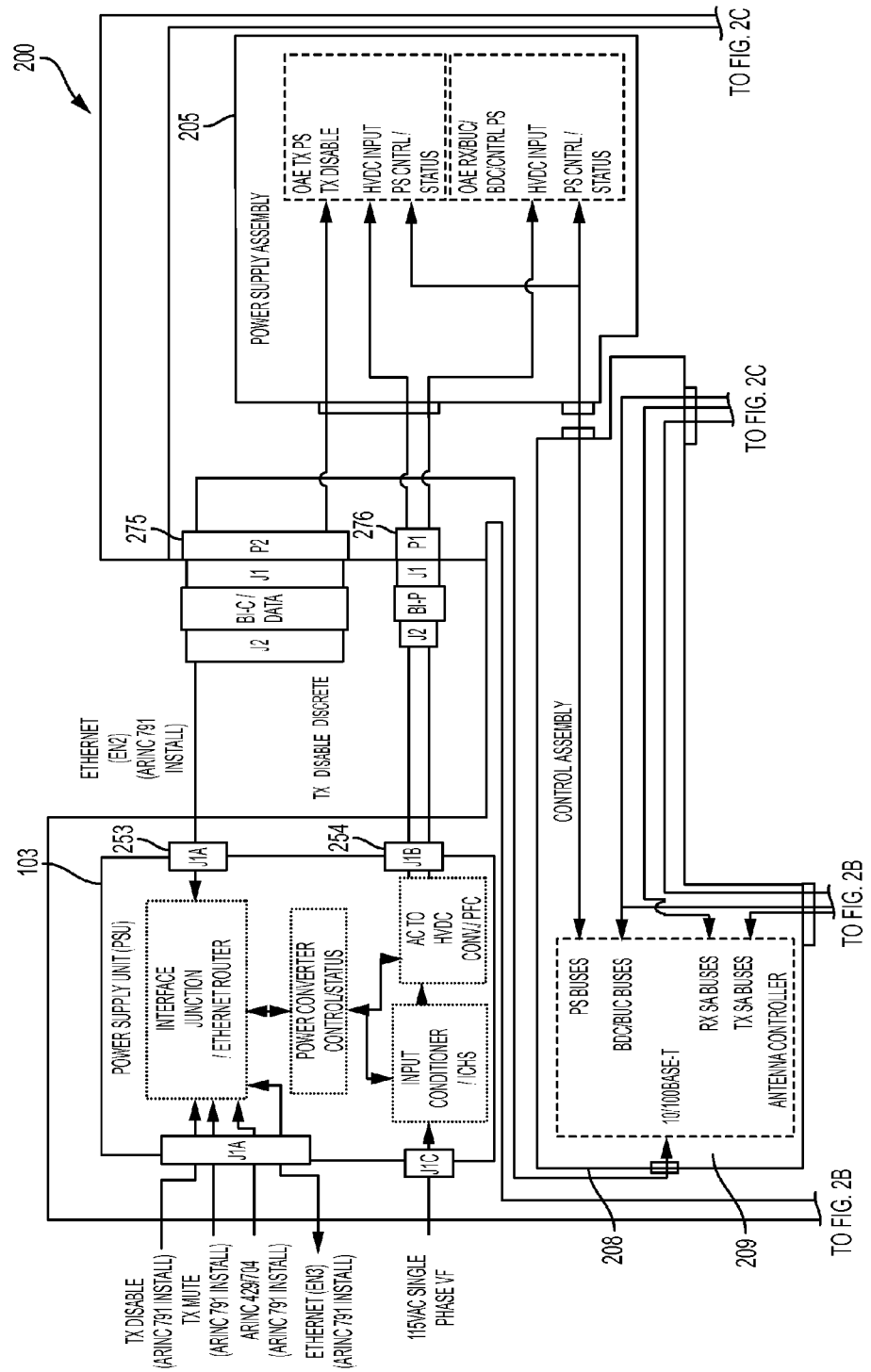
FIG. 2, which is comprised of FIGS. 2A, 2B, 2C, 2D and 2E arranged as illustrated in Key to FIG. 2, illustrates a phased array antenna subsystem in accordance with an embodiment of the disclosure.
Figure 2B:
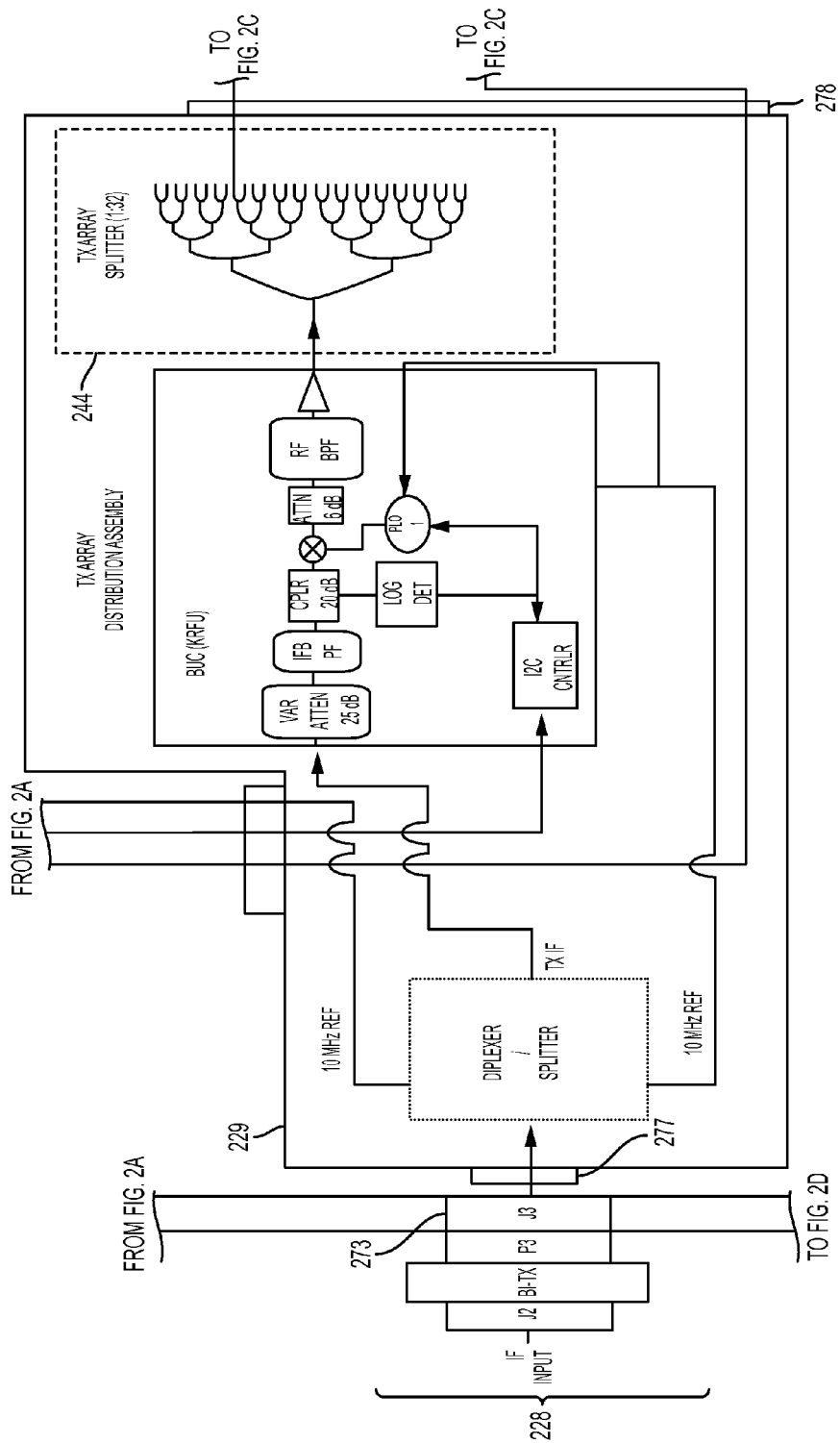
Figure 2C:
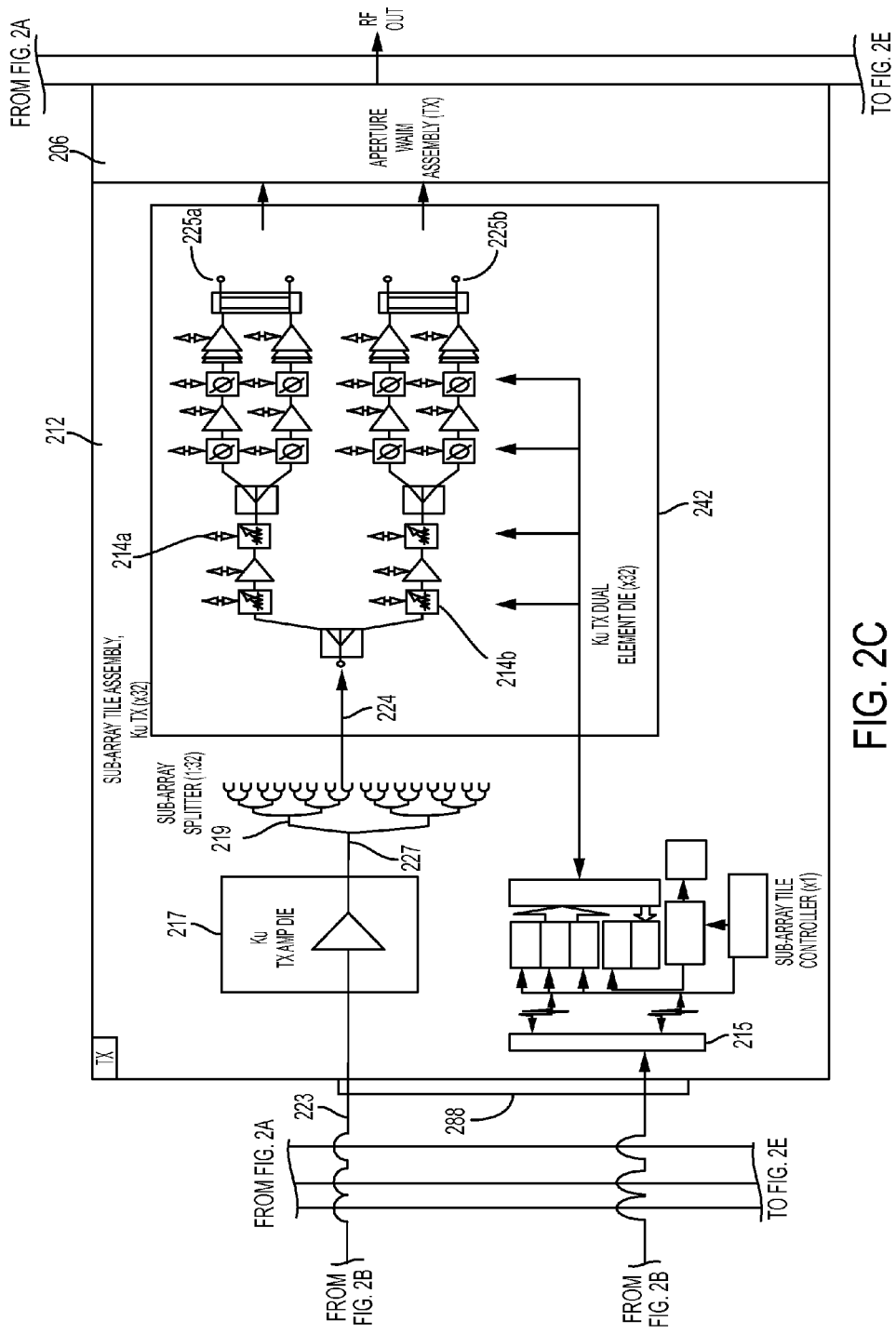
Figure 2D:
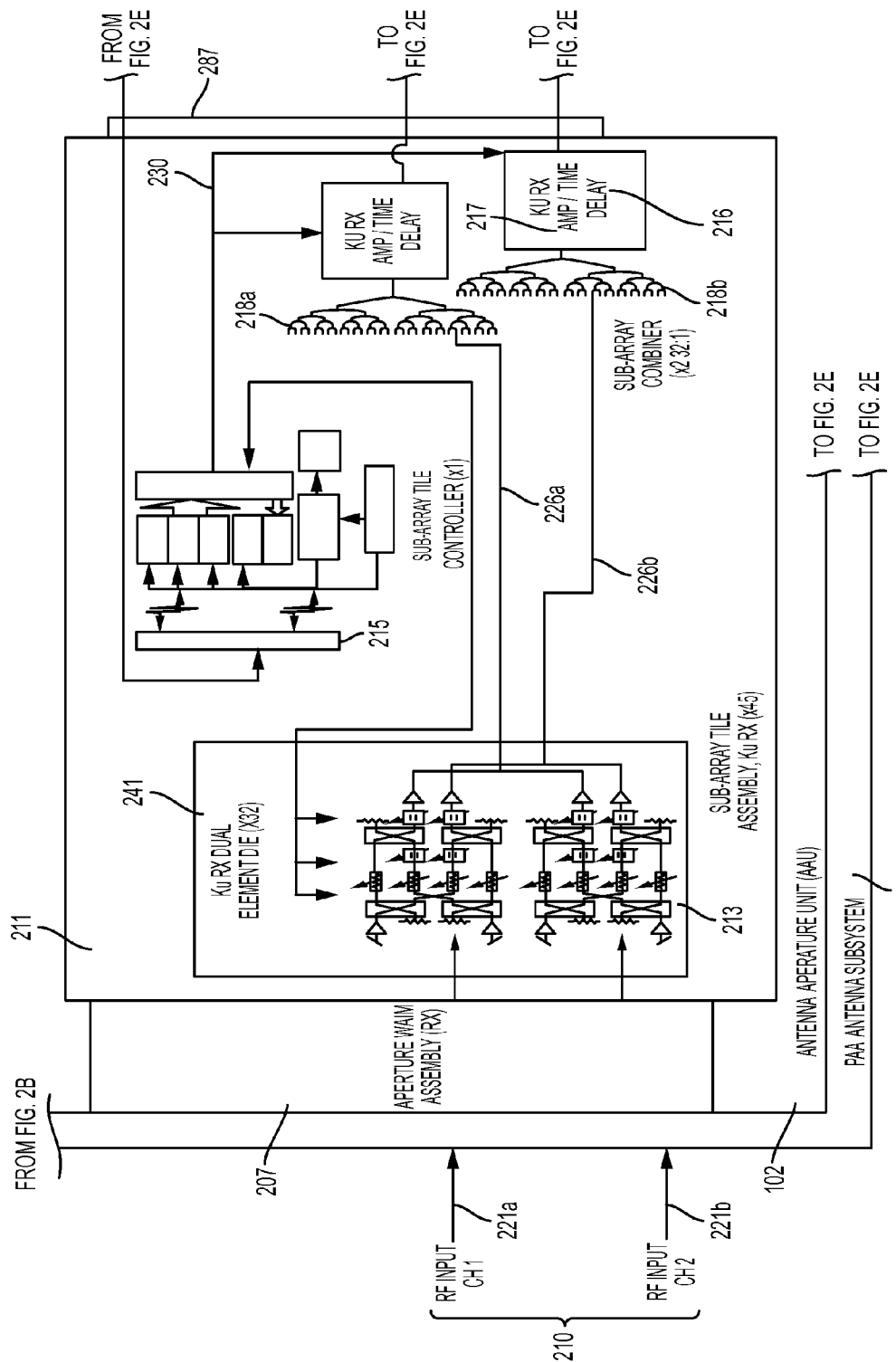
Figure 2E:
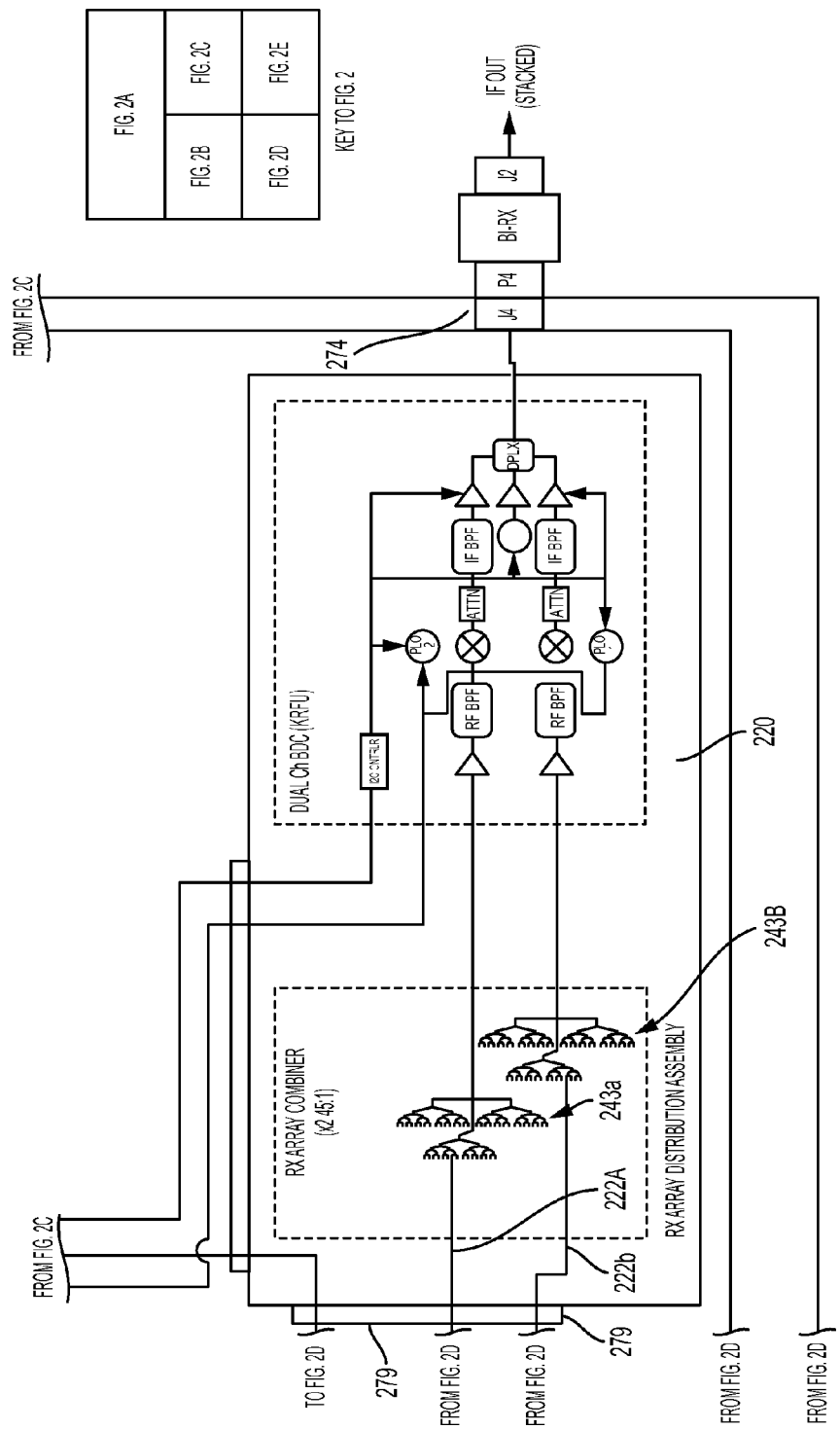
Figure 3:
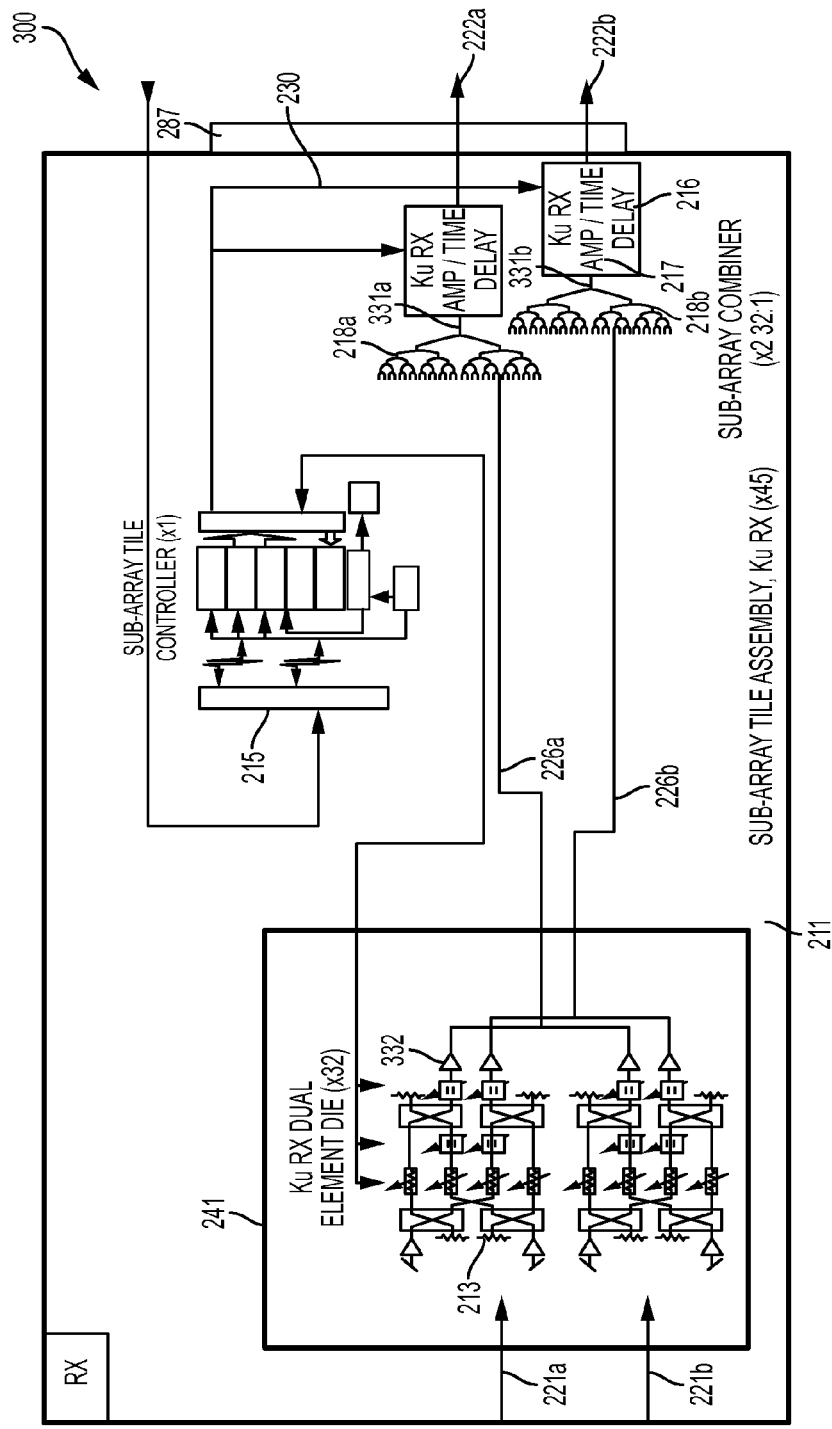
FIG. 3 illustrates a receive sub-array tile assembly system in accordance with an embodiment of the disclosure.

Selectable signal delay circuit 216 may be coupled to a receive sub-array tile output port 222a (as shown in FIG. 2E). Receive sub-array tile assembly 211 first RF output signal (e.g., first RF signal at output port 222a) may be provided at a receive sub-array tile assembly 211 output connector 287 (as shown in FIG. 3). Output connector 287 may be coupled to receive array distribution assembly 220 input connector 279 to accept first RF output signal (as shown in FIG. 2E). Still referring to FIG. 2E, input connector 279 may be coupled to a first receive array combiner circuit 243a (e.g., 45:1 combiner circuit) to combine one or more receive sub-array tile assembly 211 first RF output signals. Further, combined first RF output signals may be downconverted in receive array distribution assembly 220.

In some embodiments, forty-five receive sub-array tile assembly 211 first RF output signals may be coupled to input connector 279 and may be combined within receive array distribution assembly 220 by first receive array combiner circuit 243a. First receive array combiner circuit 243a may provide a coherently combined first RF signal for downconversion. A downconverted IF signal may be provided at antenna aperture unit output connector 274.

In some embodiments, two receive element circuits 213 may be integrated within a single die to form receive dual element circuit die 241. It will be appreciated receive dual element circuit die 241 may accept two receive aperture WAIM assembly ap antenna elements RF signals (e.g., first and second antenna elements RF signals 221a and RF signal 221b) and the signal flow for receive signal path 210 of second RF signal 221b originating at second antenna element of receive aperture WAIM assembly 207 is similar to signal path 210 for first RF signal 221a originating at first antenna element as discussed herein. Sub-array combiner circuit 218b, second distributed gain circuit 217, and second selectable signal delay circuit 216 may be included in second signal flow for receive signal path 210 of second RF signal originating at second antenna element.

In this regard, sub-array combiner circuit 218b may be implemented as a 32:1 combiner wherein thirty-two RF signals corresponding to thirty-two receive dual element circuit die 241 output signals 226b may be combined into second combined RF signal. The second combined RF signal may be received at a second distributed gain circuit 217 input port wherein second distributed gain circuit 217 may provide an amplification of the second combined RF signal. Distributed gain circuit 217 output signal may be received at an input port of a second selectable signal delay circuit 216 to selectively time delay the amplified signal. Further, second selectable signal delay circuit 216 may provide a selectable amplification of RF signal traveling from the input port to an output port of second selectable signal delay circuit similar to first selectable signal delay circuit as discussed herein. Second selectable signal delay circuit 216 output may be coupled to receive sub-array tile output port 222b. Receive sub-array tile assembly 211 second RF output signal (e.g., second RF signal at output port 222b) may be provided at receive sub-array tile assembly 211 output connector 287. Output connector 287 may be coupled to receive array distribution assembly 220 input connector 279 to accept second RF output signal. Input connector 279 may be coupled to a second receive array combiner circuit 243b (e.g., 45:1 combiner circuit). Forty-five receive sub-array tile assembly 211 second RF output signals (e.g., second RF signal at output port 222b) may be combined within receive array distribution assembly 220 by second receive array combiner circuit 243b to provide a coherently combined second RF signal for downconversion.

Antenna aperture unit 102 may include a transmit signal path 228 as shown in FIGS. 2B and 2C. Transmit signal path 228 may include transmit array distribution assembly 229, transmit sub-array tile assembly 212 and a transmit aperture WAIM assembly 206. In some embodiments, antenna aperture unit 102 may include one transmit array distribution assembly 229, thirty-two transmit sub-array tile assemblies 212 and one transmit aperture WAIM assembly 206 wherein transmit aperture WAIM assembly 206 includes sixty-four antenna elements.

Transmit sub-array tile assembly 212 may include a plurality of transmit dual element circuit die 242, a sub-array splitter circuit 219, a sub-array tile controller 215, and distributed gain circuit 217. Distributed gain circuit 217 may be integrated within one of the substrates 538 (see FIG. 5) as described herein. In some embodiments, transmit sub-array tile assembly 212 includes thirty-two transmit dual element circuit die 242, one sub-array splitter circuit 219, one sub-array tile controller 215 and one distributed gain circuit 217. It will be appreciated that transmit sub-array tile assembly 212 includes physical space for non-element circuits such as distributed gain circuit 217 to improve key antenna performance parameters such as noise figure and linearity.

A signal path for transmit signal path 228 may start at transmit array distribution assembly 229. Antenna aperture unit 102 may receive an intermediate frequency (IF) signal at an input connector 273. Transmit array distribution assembly 229 may be coupled to input connector 273 to receive IF signal at an input connector 277 and upconvert IF signal to an RF signal. Further, RF signal may be divided by a transmit array splitter circuit 244 within transmit array distribution assembly 229. In some embodiments, transmit array splitter circuit 244 may be implemented as a 1:32 splitter wherein RF signal is divided to form thirty-two divided RF signals. The thirty-two divided RF signals may be provided at an output connector 278. The thirty-two divided RF signals may be coupled to thirty-two transmit sub-array tile assemblies 212, wherein each transmit sub-array tile assembly 212 may receive a corresponding one divided RF signal.

Transmit sub-array tile assembly 212 may be coupled to transmit array distribution assembly 229 output connector 278 at an input connector 288. Distributed gain circuit 217 may receive divided RF signal at an input port 223 and provide an amplification of divided RF signal to offset an insertion loss of transmit array splitter circuit 244. Distributed gain circuit 217 may provide an amplified RF signal to sub-array splitter circuit 219 at output port 227. In some embodiments, sub-array splitter circuit 219 may be implemented as a 1:32 splitter wherein the amplified RF signal received from the output port 227 may be divided to form thirty-two divided RF signals. Each divided RF signal may be received by a corresponding one of thirty-two transmit dual element circuit die 242 at an input port 224.

Transmit dual element circuit die 242 may split divided RF signal to form two RF signals. In some embodiments, two transmit element circuits 214 are integrated within transmit dual element circuit die 242. In this regard, each split RF signal is received by a corresponding one of two transmit element circuits 214. Transmit element circuit 214 may perform RF signal phase shift, attenuation and amplification functions and provide a resultant RF signal at one of two transmit element circuit output ports 225a and 225b. A first transmit element circuit 214a may provide a resultant RF signal at output port 225a where output port 225a is configured as a branch line coupled output port. A second transmit element circuit 214b may provide a resultant RF signal at output port 225b where output port 225b is configured as a branch line coupled output port. Output ports 225a and 225b may be connected to corresponding antenna elements included within transmit aperture WAIM assembly 206.

FIG. 3 illustrates a receive sub-array tile assembly system 300 in accordance with an embodiment of the disclosure. In FIG. 3, receive sub-array tile assembly 211 (e.g., a representative receive sub-array tile assembly system 300) may include a plurality of antenna elements included in receive aperture WAIM assembly 207 (as shown in FIG. 2D), a plurality of receive element circuits 213 wherein each receive element circuit 213 may be coupled to corresponding one of the plurality of receive aperture WAIM assembly 207 antenna elements to receive the RF signal (e.g., RF signal 221a or 221b) at an input port and configured to provide an amplification and phase shift to the RF signal. Further, a plurality of sub-array combiner circuits 218a and 218b may be coupled to the plurality of receive element circuits 213. In operation, the sub-array combiner circuits 218a and 218b are adapted to combine the plurality of amplified and phase shifted RF signals to form the combined RF signal 331a or 331b.

A sub-array tile controller 215 may control amplification and phase shift functions of RF signal 221a or 221b within receive element circuit 213. Receive element circuit 213 may perform RF signal phase shift, attenuation and amplification functions and provide an amplified and phase shifted RF signal at receive element circuit output port 226a or 226b.

Receive sub-array tile assembly 211 (e.g., representative receive sub-array tile assembly system 300) may include two distributed gain circuits 217 (e.g., shown as Ku RX AMP in FIG. 3) coupled to the plurality of sub-array combiner circuits 218a and 218b to receive the combined RF signal (e.g., combined RF signal 331a or 331b) at an input port and configured to provide an amplification to the combined RF signal. A selectable signal delay circuit 216 (e.g., shown as TIME DELAY in FIG. 3) is coupled to distributed gain circuit 217 to receive the amplified combined RF signal at an input and configured to provide a delay to the amplified combined RF signal at an output as discussed further herein. Output connector 287 is coupled to each of the two selectable signal delay circuit output signals (e.g., output signal 222a and 222b).

Regarding receive signal path 210, each receive element circuit 213 may include a first amplification stage 332. Distributed gain circuit 217 may be coupled to the plurality of receive element circuits 213 through sub-array combiner circuits 218a and 218b, wherein distributed gain circuit 217 receives the first stage amplified and combined signal from sub-array combiner circuits 218a and 218b and provides a second amplification stage. Providing a second amplification in receive signal path 210 provides for a balanced amplification between receive element circuits 213 and the signal distribution structure (e.g., receive array distribution assembly 220) by offsetting an insertion loss of sub-array combiner circuits 218a and 218b. Maintaining high RF signal amplification positively impacts key RF characteristics of antenna subsystem 101 (e.g., improved antenna noise figure and linearity).

In some embodiments, two receive element circuits 213 may be integrated within receive dual element circuit die 241. In this regard, integrating two receive element circuits 213 within one die may provide for efficient use of physical space within receive sub-array tile assembly 211. For example, thirty-two receive dual element circuit die 241 may be coupled to sixty-four antenna elements of receive aperture WAIM assembly 207. The area saved by integrating two receive element circuits 213 within receive dual element circuit die 241 may create space in receive sub-array tile assembly 211 for inclusion of substrate 538 (e.g., non-element circuits distributed gain circuit 217 and selectable signal delay circuit 216). The ability to include non-element circuits on receive sub-array tile assembly 211 may provide a low cost, scalable, high performance broad bandwidth phased array antenna subsystem.

Receive sub-array tile assembly 211 may include sub-array controller circuit 215 to control selectable signal delay circuit 216 to select the desired signal delay (e.g., time delay). In some embodiments, sub-array tile controller 215 switch control signal 230 may select one of eight signal delays in a signal path between the input and output of selectable signal delay circuit 216 as discussed further herein.

Figure 4:
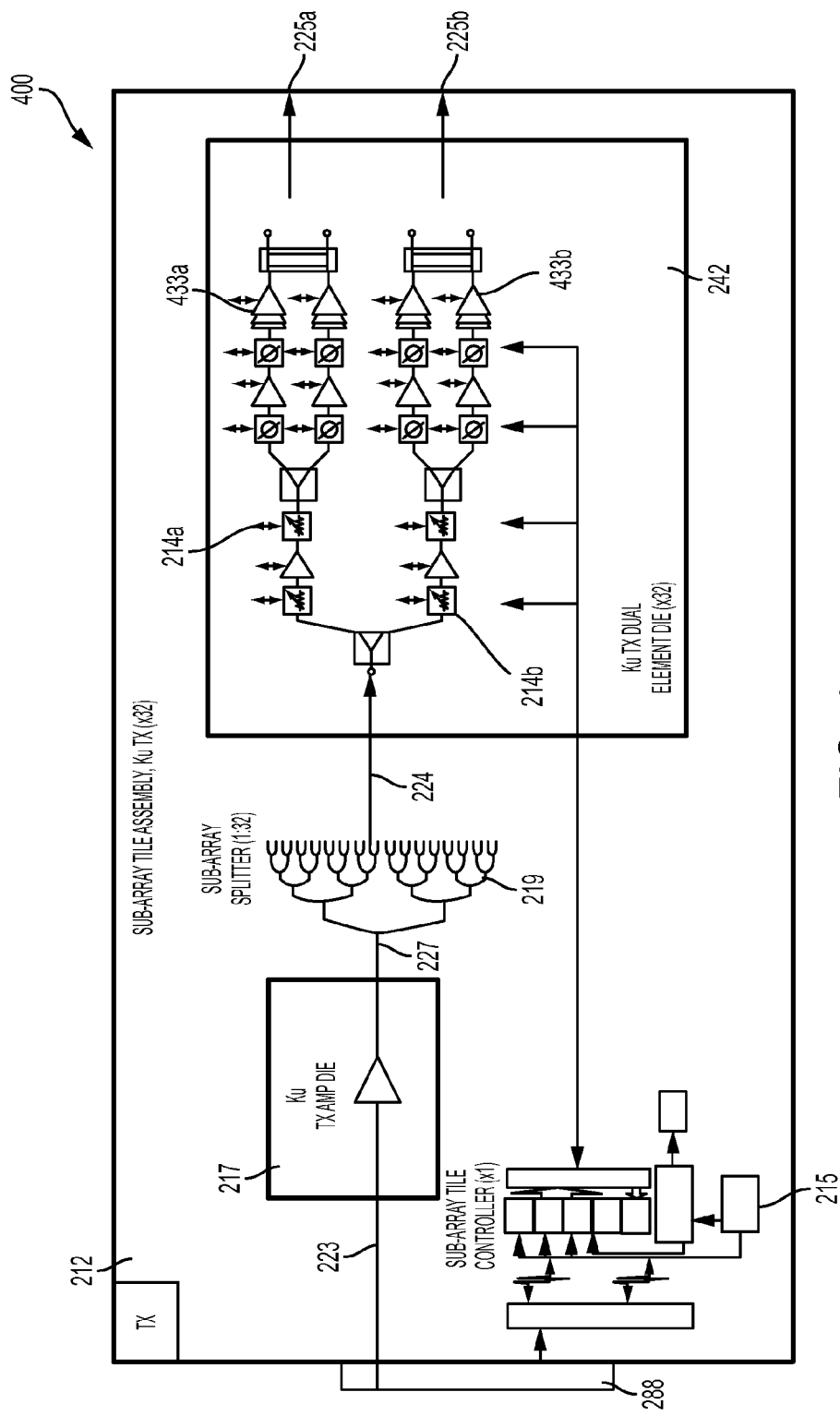
FIG. 4 illustrates a transmit sub-array tile assembly system in accordance with an embodiment of the disclosure.

FIG. 4 illustrates a transmit sub-array tile assembly system 400 in accordance with an embodiment of the disclosure. In FIG. 4, transmit sub-array tile assembly 212 (e.g., a representative transmit sub-array tile assembly system 400) may include sub-array splitter circuit 219 and a plurality of transmit dual element circuit die 242. In some embodiments, transmit sub-array tile assembly 212 includes thirty-two transmit dual element circuit die 242.

Transmit sub-array tile assembly 212 may also include distributed gain circuit 217 (e.g., shown as Ku TX AMP DIE in FIG. 4) adapted to receive an RF signal at input port 223 coupled to input connector 288. Distributed gain circuit 217 may be configured to amplify the RF signal and provide the amplified RF signal at output port 227. Distributed gain circuit 217 amplification stage may be included within transmit signal path 228 between transmit array splitter circuit 244 (see FIG. 2B) and sub-array splitter circuit 219. Including an amplification stage in transmit signal path 228 provides for a balanced amplification between the signal distribution structure (e.g., transmit array distribution assembly 229) and transmit dual element circuit die 242 by offsetting an insertion loss of transmit array splitter circuit 244.

A plurality of sub-array splitter circuits 219 may be coupled to distributed gain circuit 217 output port 227 to receive amplified RF signal and configured to divide amplified RF signal to form a plurality of amplified RF signals. In some embodiments, a 1:32 sub-array splitter circuit 219 divides the amplified RF signal into thirty-two amplified RF signals. In some embodiments, thirty-two transmit dual element circuit die 242 are each coupled to a respective sub-array splitter circuit 219 such that each transmit dual element circuit die 242 receives a corresponding amplified RF signal at the input port 224. The amplified RF signal is further divided into two RF signals within transmit dual element circuit die 242, wherein each of the two divided RF signals is coupled to a corresponding transmit element circuit 214.

In the illustrated embodiment of FIG. 2C, two transmit element circuits 214 (e.g., transmit element circuits 214a and 214b) are integrated within transmit dual element circuit die 242. In this regard, integrating two transmit element circuits 214 within one die provides for efficient use of physical space within transmit sub-array tile assembly 212. For example, thirty-two transmit dual element circuit die 242 may couple to sixty-four antenna elements of transmit aperture WAIM assembly 206. The area saved by integrating two transmit element circuits 214 within transmit dual element circuit die 242 provides additional physical space in transmit sub-array tile assembly 212 for inclusion of substrate 538 with distributed gain circuit 217 included therein. The ability to include non-element circuits such as distributed gain circuit 217 in transmit sub-array tile assembly 212 may provide a low cost, scalable, high performance broad bandwidth phased array antenna subsystem 101.

Sub-array tile controller 215 may control amplification and phase shift functions of divided RF signal within transmit element circuit 214. The first and second transmit element circuit 214a and 214b may perform RF signal phase shift. Moreover, attenuation and amplification circuits 433a and 433b perform amplification. Accordingly, an amplified and phase shifted RF signal is provided at the transmit dual element circuit die 242 output port 225a and 225b, respectively. One of sixty-four antenna elements (e.g., 206) may be coupled to a corresponding one of thirty-two transmit dual element circuit die 242 output ports 225a or 225b to receive the amplified and phase shifted RF signal.

The amplifier circuits 433a and 433b may be included in transmit element circuit 214 to provide RF signal amplification in signal path 228. Distributed gain circuit 217 and amplifier circuit 433 provide a balanced amplification architecture wherein RF signal amplification is maintained within the transmit signal path 228 to positively impact key RF characteristics of antenna subsystem 101 (e.g., improved antenna noise figure and linearity).

Figure 5:
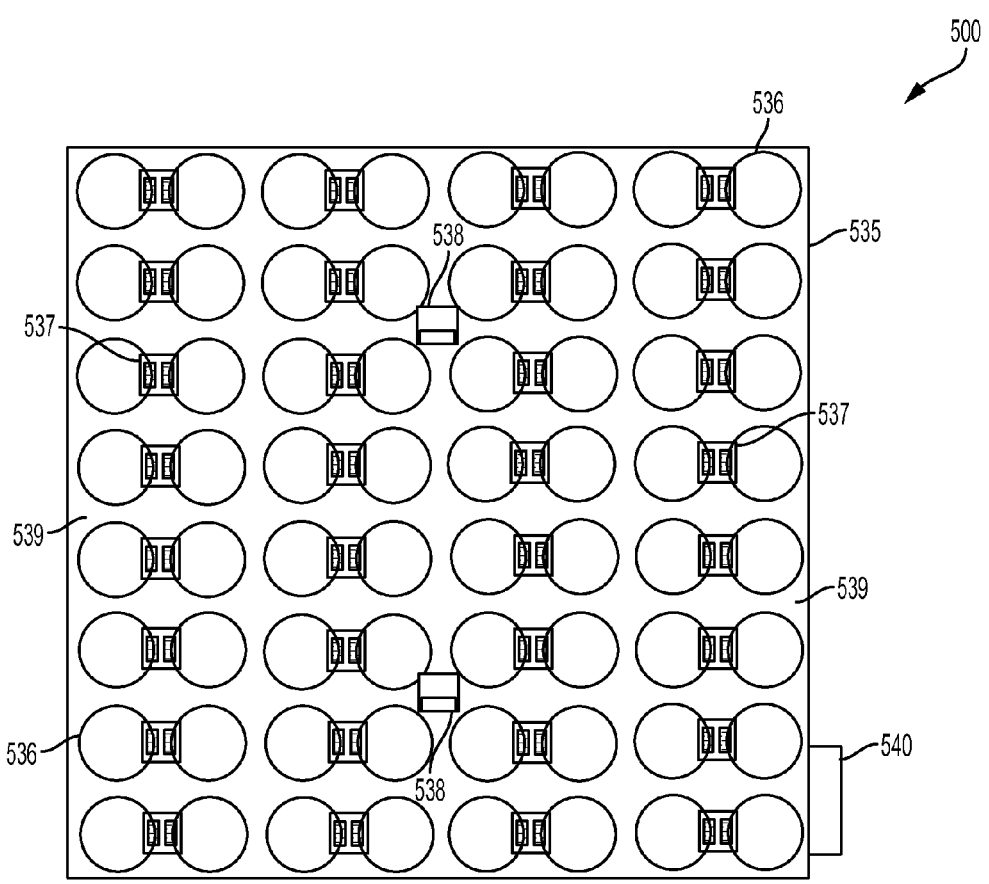
FIG. 5 illustrates a sixty-four element sub-array tile assembly system in accordance with an embodiment of the disclosure.

FIG. 5 illustrates a sixty-four element sub-array tile assembly system 500 in accordance with an embodiment of the disclosure. In some embodiments, sixty-four element sub-array tile assembly 535 (e.g., a representative sixty-four element sub-array tile assembly system 500) includes a substantially planar circuit board 539, sixty-four antenna elements 536 integrated with circuit board 539, and thirty-two dual element circuit die 537 including two element circuits for each dual element circuit die 537 coupled to circuit board 539. In some embodiments, thirty-two dual element circuit die 537 are coupled to a corresponding two of the sixty-four antenna elements 536. Other embodiments are possible wherein thirty-two dual element circuit die 537 may be coupled to corresponding fewer or more of the sixty-four antenna elements 536. Circuit board 539 may be implemented as a printed wiring board, a motherboard, a substrate, or other interconnect structure. In some embodiments, antenna elements 536 and dual element circuit die 537 may be arranged in a planar form (e.g., tiled array) on circuit board 539. However, other arrangements such as a brick form may be possible. Antenna elements 536 and dual element circuit die 537 are preferably connected by microstrip within circuit board 539. However, other methods of connection may be possible such as waveguide or coax cable. In FIG. 5, antenna elements 536 are representative of antenna elements within receive aperture WAIM assembly 207 and transmit aperture WAIM assembly 206.

One or more substrates 538 may be coupled to one or more dual element circuit die 537. Substrate 538 may include distributed gain circuit 217 and selectable signal delay circuit 216 as discussed herein. A connector 540 may couple a plurality of RF, digital and analog signals between sixty-four element sub-array tile assembly 535 and other components and/or circuits of antenna subsystem 101. Sixty-four element sub-array tile assembly 535 may include two memory components and a sub-array tile controller 215 (both not shown). It should be appreciated sixty-four element sub-array tile assembly 535 may include more or fewer antenna elements 536 and/or dual element circuit die 537 in accordance with other embodiments of the disclosure.

In some embodiments, sixty-four element sub-array tile assembly 535 (e.g., element array) may be configured as a receive sub-array tile assembly 211 as shown in FIG. 2D. Accordingly, the receive sub-array tile assembly 211 may include sixty-four antenna elements 536 capable of receiving RF signals. The receive sub-array tile assembly 211 may also include thirty-two receive dual element circuit die 241 (e.g., sixty-four receive element circuits 213) as discussed herein. Receive dual element circuit die 241 may be similar to dual element circuit die 537 in construction, however receive dual element circuit die 241 functionality may be specific to receive sub-array tile assembly 211 as discussed herein.

Referring again to FIG. 2D, receive sub-array tile assembly 211 may include a sub-array combiner circuit 218a integrated with circuit board 539, adapted to connect the plurality of receive dual element circuits 213 output signals 226a to form the combined RF signal 331a. Receive sub-array tile assembly 211 may include a sub-array combiner circuit 218b integrated with circuit board 539 and adapted to connect the plurality of receive element circuits 213 output signals 226b to form combined RF signal 331b. Receive sub-array tile assembly 211 may include two substrates 538. Each substrate 538 may include distributed gain circuit 217 and selectable signal delay circuit 216.

In some embodiments, sixty-four element sub-array tile assembly 535 may be configured as transmit sub-array tile assembly 212 as shown in FIG. 2C. In this regard, transmit sub-array tile assembly 212 may include sixty-four antenna elements 536 capable of transmitting RF signals. Transmit sub-array tile assembly 212 may include thirty-two transmit dual element circuit die 242, wherein each transmit dual element circuit die 242 includes two transmit element circuits 214. Transmit dual element circuit die 242 may be similar to dual element circuit die 537 in construction, however transmit dual element circuit die 242 functionality may be specific to transmit sub-array tile assembly 212 functionality as discussed herein.

Referring to FIG. 2C, transmit sub-array tile assembly 212 may include a sub-array splitter circuit 219 integrated with circuit board 539. Sub-array splitter circuit 219 may be adapted to divide an amplified RF signal and connect to thirty-two transmit dual element circuit die 242. Transmit sub-array tile assembly 212 may also include one substrate 538 including distributed gain circuit 217.

Referring again to FIG. 5, the area saved by integrating two element circuits within dual element circuit die 537 as discussed herein may provide physical space in sixty-four element sub-array tile assembly 535 for inclusion of substrate 538. Packaging substrate 538 with antenna elements 536 and dual element circuit die 537 on circuit board 539 provides an effective integration of non-element and element electronic functions. Including non-element functions on circuit board 539 further provides for improved antenna subsystem 101 performance while also providing a low cost and scalable solution for integrating a wide variety of sub-array configurations. Non-element functions may be adjusted for the sub-array size.

Figure 6:
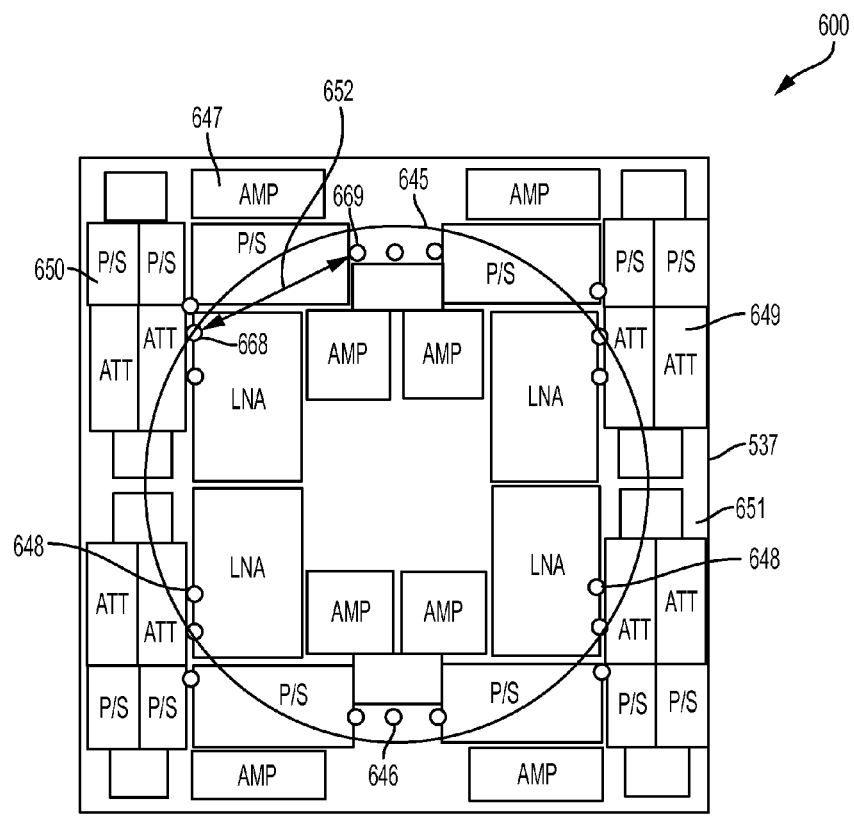
FIG. 6 illustrates a dual element circuit die layout in accordance with an embodiment of the disclosure.

FIG. 6 illustrates a dual element circuit die layout 600 having the dual element circuit die 537 integrated within an integrated circuit die 651. Integrated circuit die 651 may be a representative illustration of receive dual element circuit die 241 or transmit dual element circuit die 242. In some embodiments, integrated circuit die 651 may include one or more layers of a high frequency silicon germanium alloy. In other embodiments, integrated circuit die 651 may include one or more layers of a high frequency dielectric material such as complementary metal-oxide-semiconductor (CMOS). Integrated circuit die 651 may be a flip-chip configured with solder bump connections coupled to corresponding circuit board 539 connections.

In some embodiments, integrated circuit die 651 may include a plurality of amplification stages wherein each amplification stage includes a plurality of RF amplifiers 647 and RF attenuators 649 coupled between one or more input and output ports. A plurality of RF phase shifters 650 may also be included to provide a phase shift to a traveling RF signal between input port and output port connections. Other embodiments may be possible including active components such as RF mixers and active RF filters coupled between one or more amplification stages. A plurality of die pads 646 and 648 may couple the plurality of amplification stages and/or RF, digital and analog signals to circuit board 539 connections.

In some embodiments, the plurality of die pads 646 and 648 may be configured for one RF input port and four RF output port connections when implemented as transmit dual element circuit die 242. In this regard, adjacent die pads may be connected as an input port 668 and an output port 669, respectively. As a result, RF input port 668 may be located in close physical proximity to RF output port 669 as shown by line 652. Maintaining a maximum physical spacing between RF input and RF output ports is desired to minimize RF output to RF input signal feedback coupling. Thermally induced stresses caused by coefficient of thermal expansion (CTE) mismatches across integrated circuit die 651 may limit pad spacing from the center of integrated circuit die 651 as illustrated by radius 645, to ensure reliable connections.

Figures 12A, 12B:
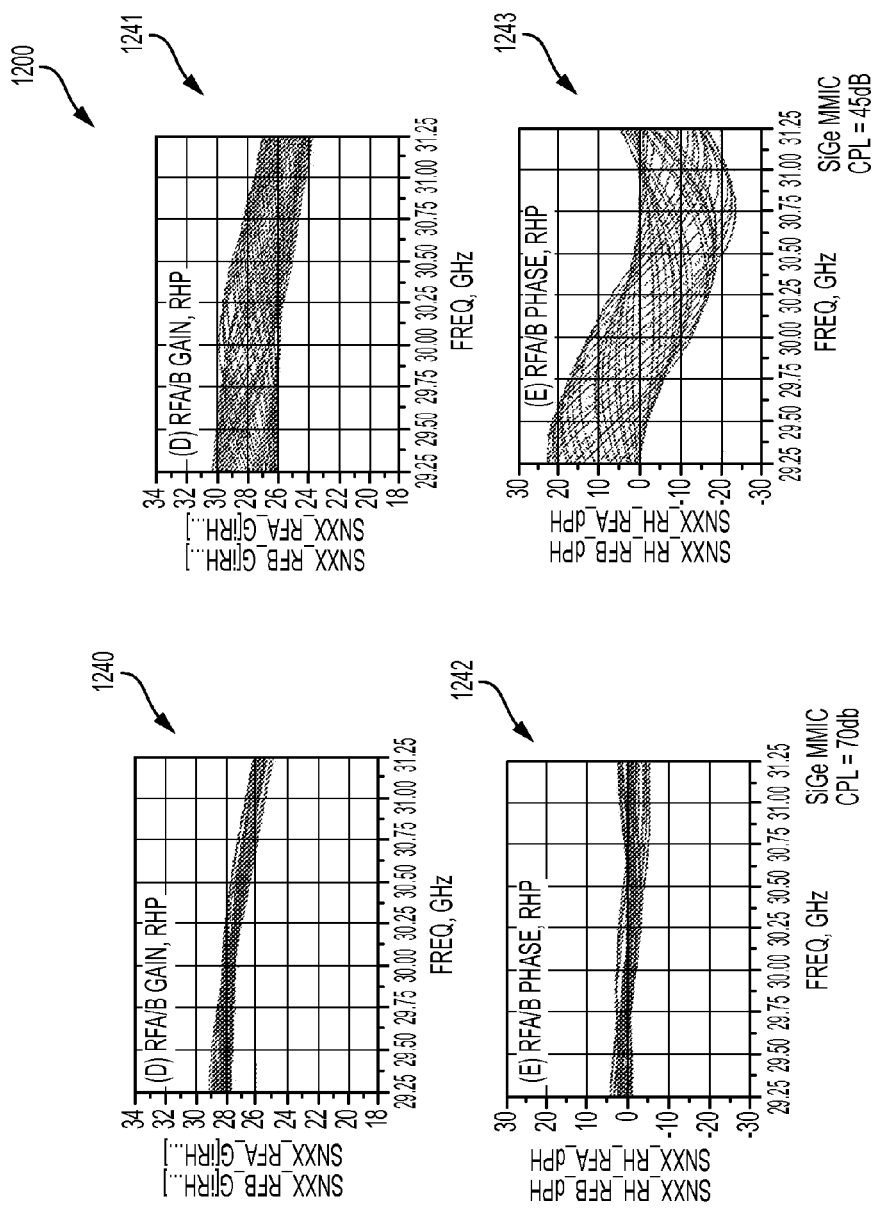
FIGS. 12A and 12B illustrate gain and phase distortion plots of a dual element circuit in accordance with embodiments of the disclosure.

RF input to RF output packaging isolation is proportional to phase and gain control. In some embodiments, antenna subsystem 101 may require five bits of gain and five bits of phase control. In this regard, approximately 25 dB more packaging isolation than RF signal amplification would be required to minimize gain and phase feedback distortion. Gain and phase feedback distortion response as a function of RF output to RF input isolation is illustrated in FIGS. 12A and 12B. Since physical spacing between RF input and RF output port die pads may be limited, the alternative to maintain 25 dB of packaging isolation may be to reduce RF signal amplification in dual element die 537.

As shown in FIGS. 2B, 2C, 2D, and 2E additional amplification may need to be added elsewhere in RF signal path (e.g., transmit signal path 228 and receive signal path 210, respectively) within antenna subsystem 101 to maintain RF signal amplification as additional losses may occur in receive array distribution assembly 220 and/or transmit array distribution assembly 229. In this regard, adding RF signal amplification with distributed gain circuit 217 may supplement RF signal amplification in dual element circuit die 537 (e.g., transmit dual element circuit die 242 and receive dual element circuit die 241). A second amplification stage for receive signal path 210 may be added after sub-array combiner circuits 218a and 218b in receive sub-array tile assembly 211 as discussed herein. An amplification stage for transmit signal path 228 may be added prior to sub-array splitter circuit 219 in transmit sub-array tile assembly 212 as discussed herein. In this regard, distributed gain circuit 217 supplements and balances an RF signal path amplification to maintain key antenna performance parameters such as noise figure and linearity.

Figure 7B:
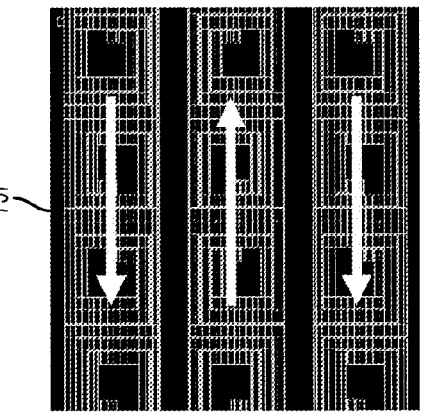
Figure 7A:
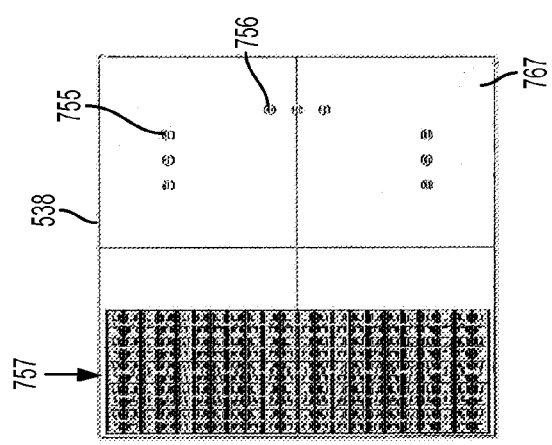

FIGS. 7A, 7B and 7C illustrate views of a true time delay function 700 which may be implemented within selectable signal delay circuit 216 (shown in FIG. 2D) to provide incremental wavelengths of delay to an RF signal traveling from an input port to an output port of selectable signal delay. FIGS. 7A, 7B, and 7C illustrate a true time delay function implemented as an example of the selectable signal delay circuit 216. Selectable signal delay circuit 216 may include a plurality of delay lines 757, as illustrated in FIG. 7B, and an input port 763 and an output port 764, wherein the delay lines 757 may be disposed between input port 763 and output port 764. A plurality of amplifiers 761 may be coupled to corresponding ones of the plurality of delay lines 757 and may be coupled between input port 763 and output port 764. A plurality of switches 762 may be configured to selectively couple the plurality of delay lines 757 and corresponding amplifiers 761 to provide a selectable delay and amplification between input port 763 and output port 764. The plurality of delay lines 757 comprise lumped element delay lines adapted as eight wavelength delay 758, four wavelength delay 759 and two wavelength delay 760, wherein delay lines 757 may be of uniform length and configured to match an insertion loss of the switch 762.

Delay lines 757 may be included within substrate 538 as shown in FIG. 7A. Delay lines 757 propagate within substrate 538 in an alternating direction as shown by white arrows in FIG. 7B. Selectable signal delay circuit 216 (FIG. 7C) may be integrated within substrate 538. Selectable signal delay circuit 216 may be integrated within substrate 538 in the space provided adjacent to delay lines 757. In some embodiments, substrate 538 may include one or more layers of high frequency silicon germanium alloy. As shown in FIG. 7A, substrate 538 may be a flip-chip configured with solder bump connections 755 and 756 coupled to corresponding circuit board 539 connections shown in FIG. 5. In various other embodiments, substrate 538 may include one or more layers of high frequency dielectric material such as RF complementary metal-oxide-semiconductor (CMOS). In various other embodiments, substrate 538 may be configured with wire bond connections coupled to corresponding circuit board 539 connections.

In some embodiments, the plurality of delay lines 757 may be lumped element delay lines 757 adapted as eight wavelength 758, four wavelength 759 and two wavelength 760 delays, wherein delay lines 757 may be of uniform length and configured to match an insertion loss of switch 762. Physical layout of delay line 757 within substrate 538 may utilize a ground plane in close proximity to delay lines 757 signal conductors. Ground plane may provide electrical stability for implementation of long delays in the small area used by the plurality of delay lines 757 within substrate 538. In some embodiments, the plurality of switches may be radio frequency (RF) switches 762 configured to select a delay of approximately zero to fourteen wavelengths in approximately two wavelength increments between input port 763 and output port 764. However, various other wavelengths of delay are possible in other embodiments.

Delay signal paths 765 may connect various configurations of wavelength delays (e.g., wavelength delays 758, 759 and 760) to achieve the desired delay. Delay signal paths 765 provide a signal path such that the plurality of delays can be switched between the input port 763 and the output port 764. Sub-array tile controller 215 (see FIG. 2) may be adapted to control the plurality of switches 762 to select a delay. In some embodiments, sub-array tile controller 215 may select from eight different delays to provide a delay resolution of approximately zero to fourteen wavelengths in two wavelength increments as discussed herein. In various other embodiments, more or fewer and/or shorter or longer selectable delays may be possible. Selectively setting the time delay may provide a coherent signal to antenna subsystem 101.

The plurality of amplifiers 761 may be RF amplifiers configured to provide an amplification to offset an insertion loss of delay lines 757 plus switches 762, wherein the amplification of the signal at input port 763 approximately equals the amplification of the signal at output port 764. Providing a balanced amplification may ensure signal amplitude and linearity is maintained as the RF signal travels from input port 763 to output port 764 within selectable signal delay circuit 216.

Delay resolution, total delay, gain, gain vs. delay, linearity and pass-band flatness may all be important characteristics necessary for broadband performance of antenna subsystem 101. Consideration of amplifier gain, gain slope, and linearity, ensure consistent gain, gain slope and time resolution over antenna subsystem 101. Implementation of true time delay function as selectable signal circuit delay 216 accounts for these characteristics and reduces size. Substrate 538 may accommodate delay line 757, selectable signal delay circuit 216 and may have sufficient space 767 to accommodate distributed gain circuit 217.

Figure 8:
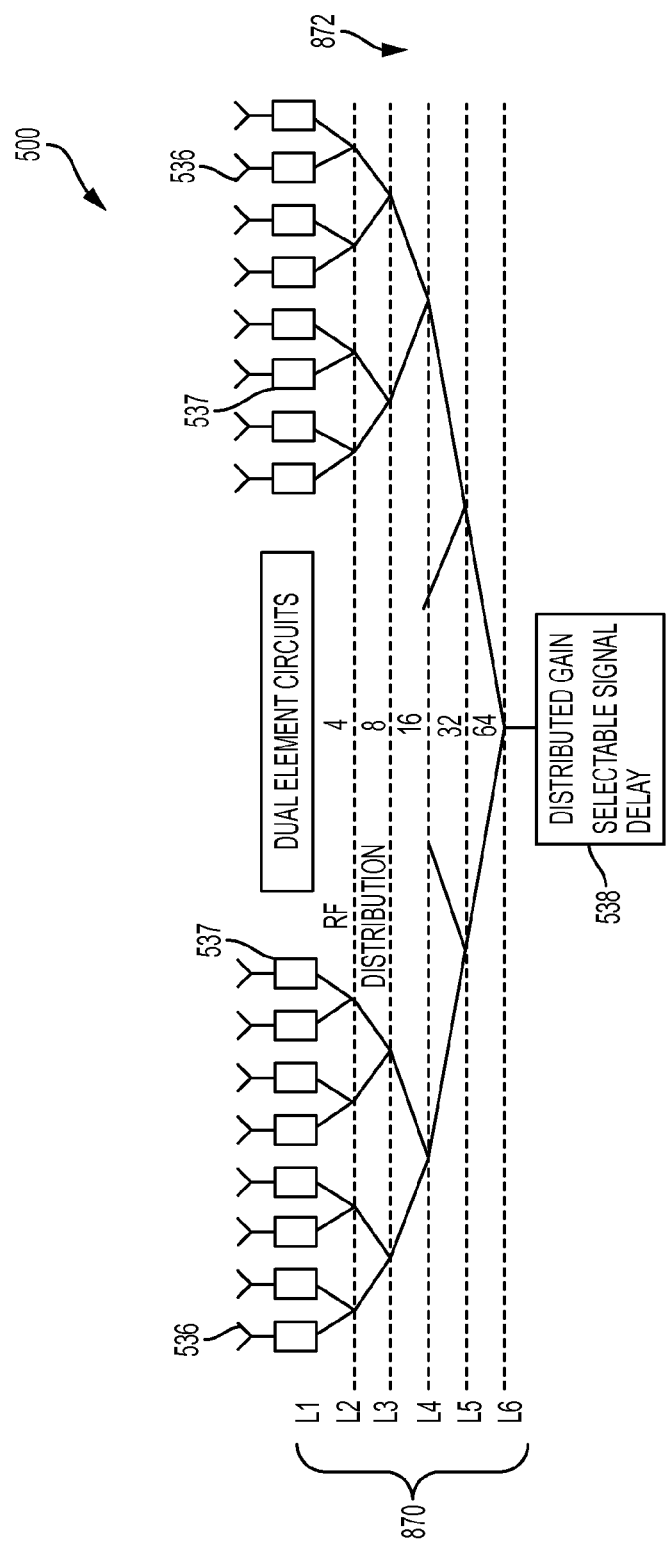
FIG. 8 illustrates a signal flow diagram of a sixty-four element sub-array tile assembly in accordance with an embodiment of the disclosure.

FIG. 8 illustrates a signal flow diagram of the sixty-four element sub-array tile assembly system 500 shown in FIG. 5. FIG. 8 provides a sixty-four element sub-array signal flow of a receive signal path 872. One or more antenna elements 536 may be coupled to dual element circuit die 537 to provide an RF signal. Dual element circuit die 537 may include one or more element circuits configured to provide a first amplification stage as discussed herein. RF signal outputs of dual element circuit die 537 may be combined at a plurality of RF distribution levels 870 L1 through L6 wherein L6 may represent a two foot length of antenna array. In some embodiments, amplified RF signals may be combined at levels L2 through L6, until at level L6, sixty-four amplified RF signals may be combined (e.g., combined RF signal 331a and 331b).

In this regard, as RF signals travel from antenna element 536 through level L6, losses associated with RF distribution networks (e.g., sub-array combiner circuits 218a and 218b and receive array distribution assembly 220 shown in FIGS. 2D and 2E) may degrade RF signal amplification. Degradation of RF signal amplification may affect key antenna performance parameters such as noise figure and linearity in antenna subsystem 101. Element circuits of dual element circuit die 537 may provide a first amplification to RF signal. However, first amplification stage may be limited due to coupling losses associated with die physical characteristics as discussed herein. In this regard, CTE mismatches may limit spacing between die pads putting input and output port die pads in close proximity. Close proximity of input and output die pads result in RF output to RF input coupling losses as discussed herein (see FIGS. 12A and 12B).

Additional RF signal amplification may need to be added elsewhere in receive signal path 872. In this regard, and referring again to FIG. 3, distributed gain circuit 217 (e.g., Ku RX AMP) may be coupled to the plurality of sub-array combiner circuits 218*a* and 218*b* to receive combined RF signal 331 (e.g., 331*a* and 331*b*) at an input port and configured to provide an amplification to the combined RF signal 331. Distributed gain circuit 217 may add an amplification to combined RF signal 331*a* and 331*b* to supplement limited RF signal amplification in dual element circuit die 537. Distributed gain circuit 217 amplification may be predetermined to offset a deterministic insertion loss of sub-array combiner circuits 218*a* and/or 218*b* and provide sufficient amplification in antenna subsystem 101 to maintain noise figure and linearity performance. Further, dual element circuit die 537 first amplification stages and distributed gain circuit 217 may be monitored by a monitor circuit 1104 (see FIG. 11) to ensure amplifier bias (e.g., direct current and DC voltage) is maintained over process, temperature and input DC supply variations as discussed herein. Monitor circuit 1104 may be integrated within substrate 538 to provide a fully integrated solution of distributed gain circuit 217 inclusion into sixty-four element sub-array tile assembly 535. Further, monitor circuit 1104 may be integrated within dual element circuit die 537 to provide a fully integrated solution for element electronics (e.g., receive element circuit 213 and transmit element circuit 214) within sixty-four element sub-array tile assembly 535.

Figure 9:
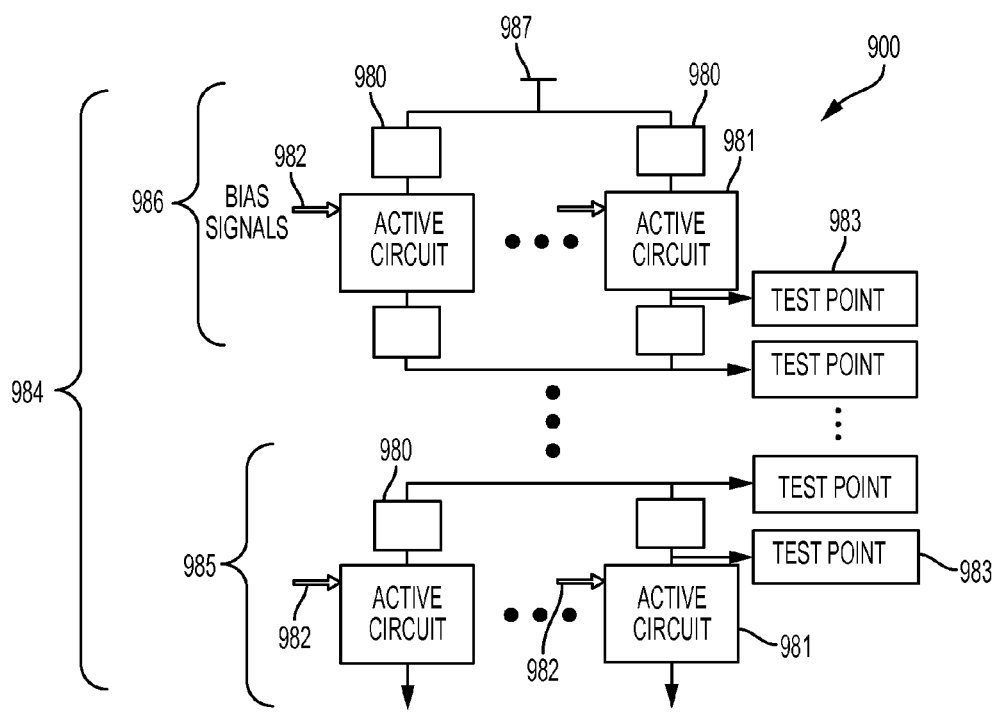
FIG. 9 illustrates an active circuits stacking diagram in accordance with an embodiment of the disclosure.
Figure 10A:
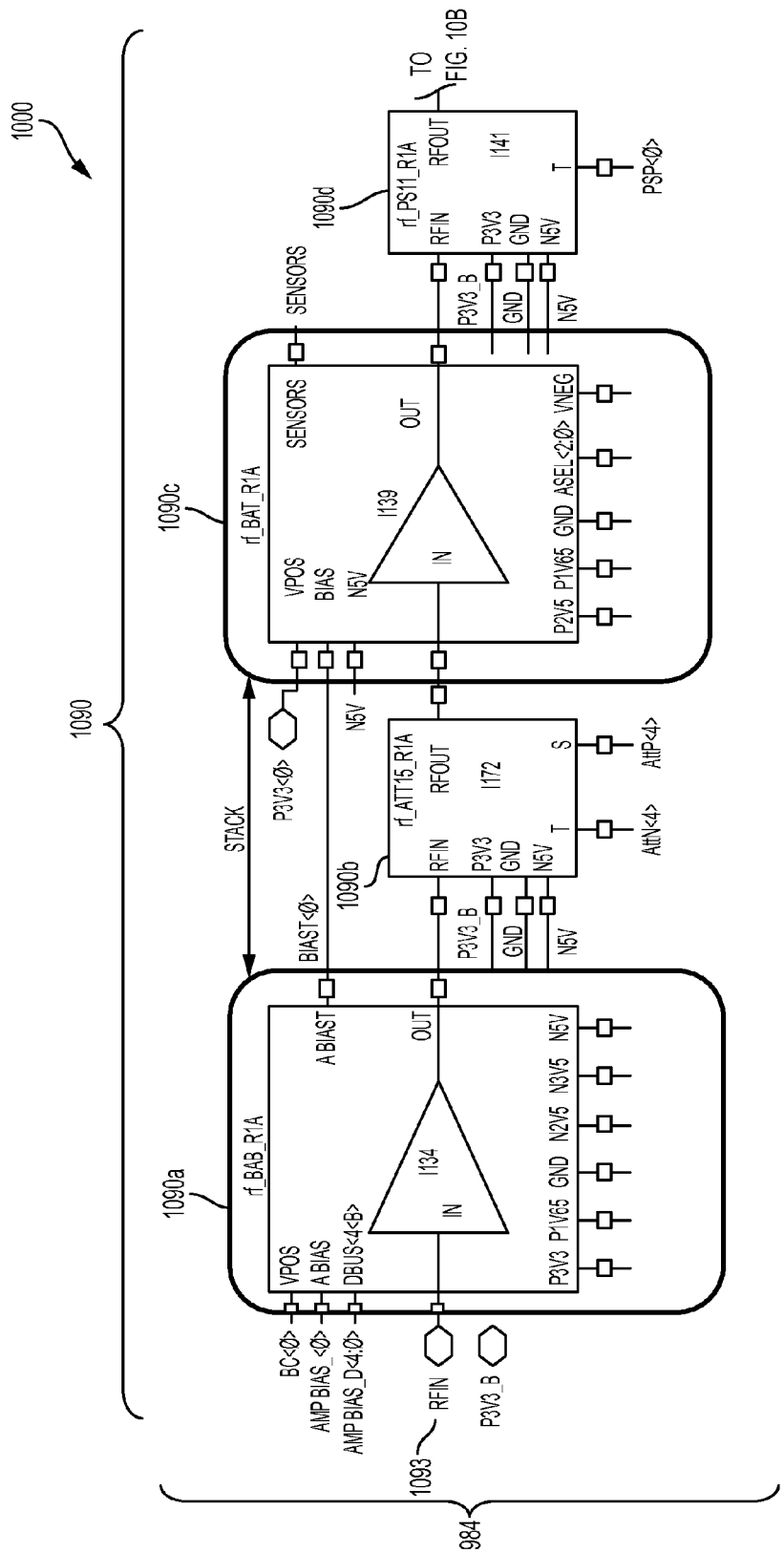
FIG. 10, which is comprised of FIGS. 10A, 10B, 10C and 10D arranged as illustrated in Key to FIG. 10, illustrates a cascaded amplifier diagram in accordance with an embodiment of the disclosure.
Figure 10B:
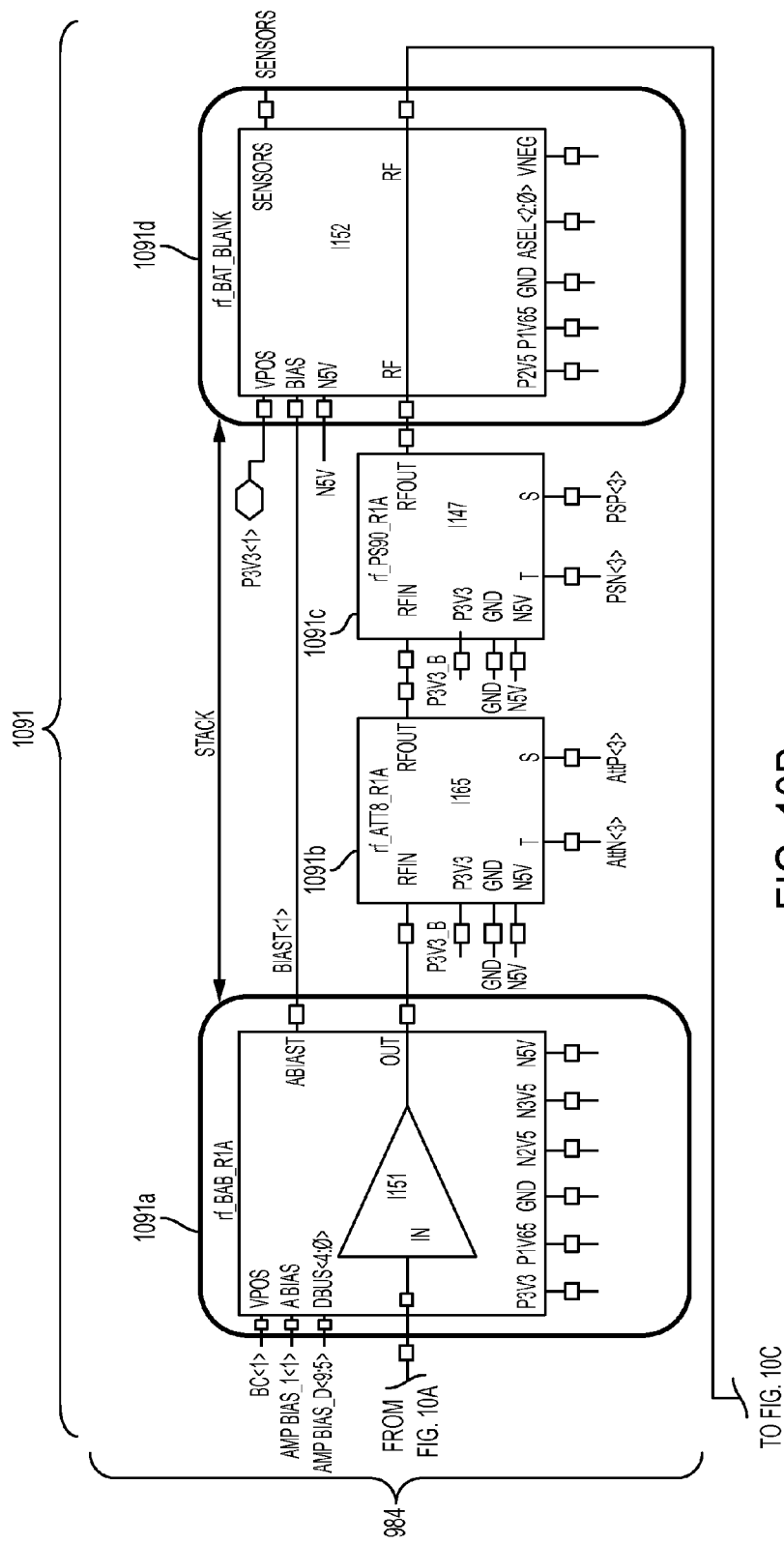
Figure 10C:
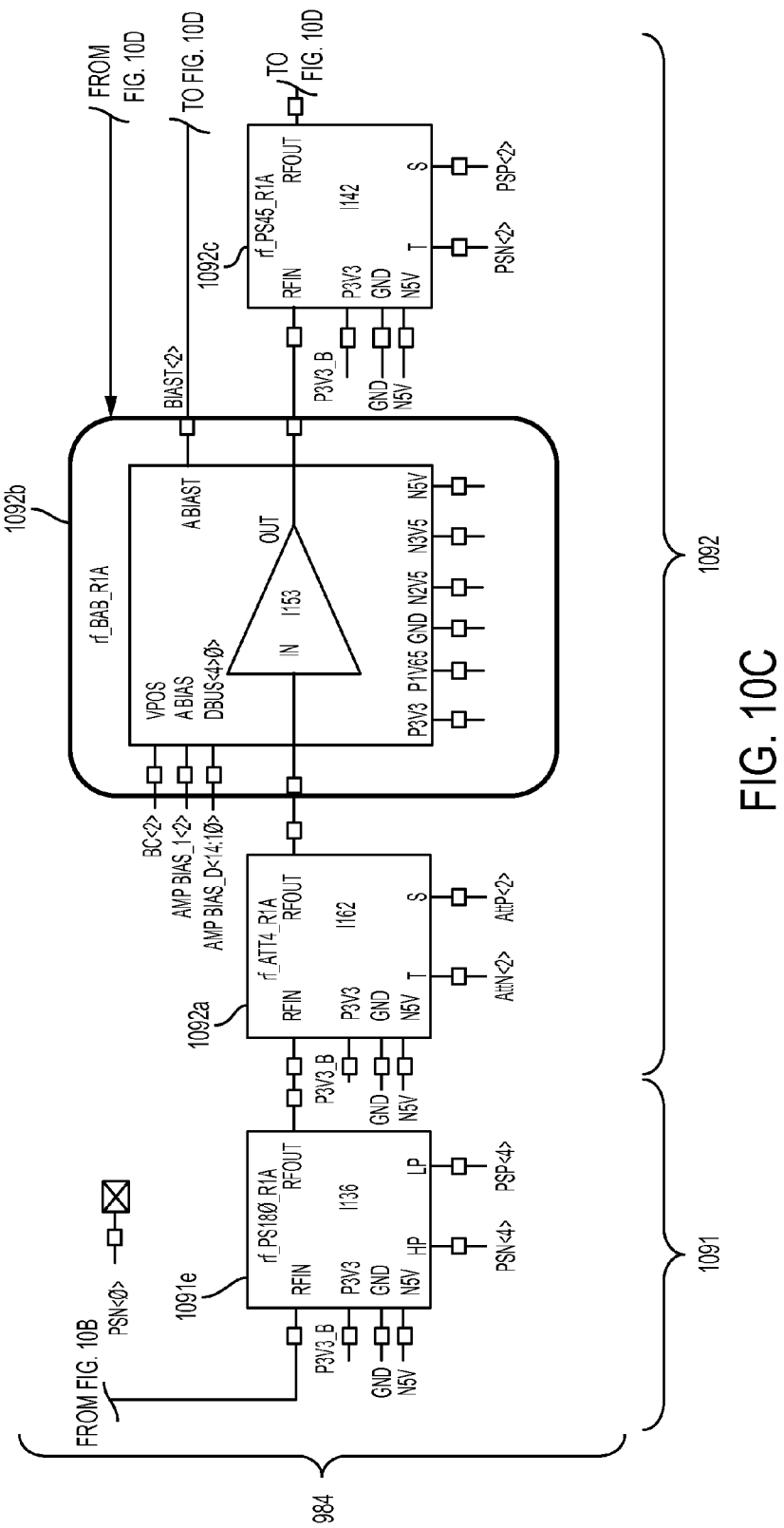
Figure 10D:
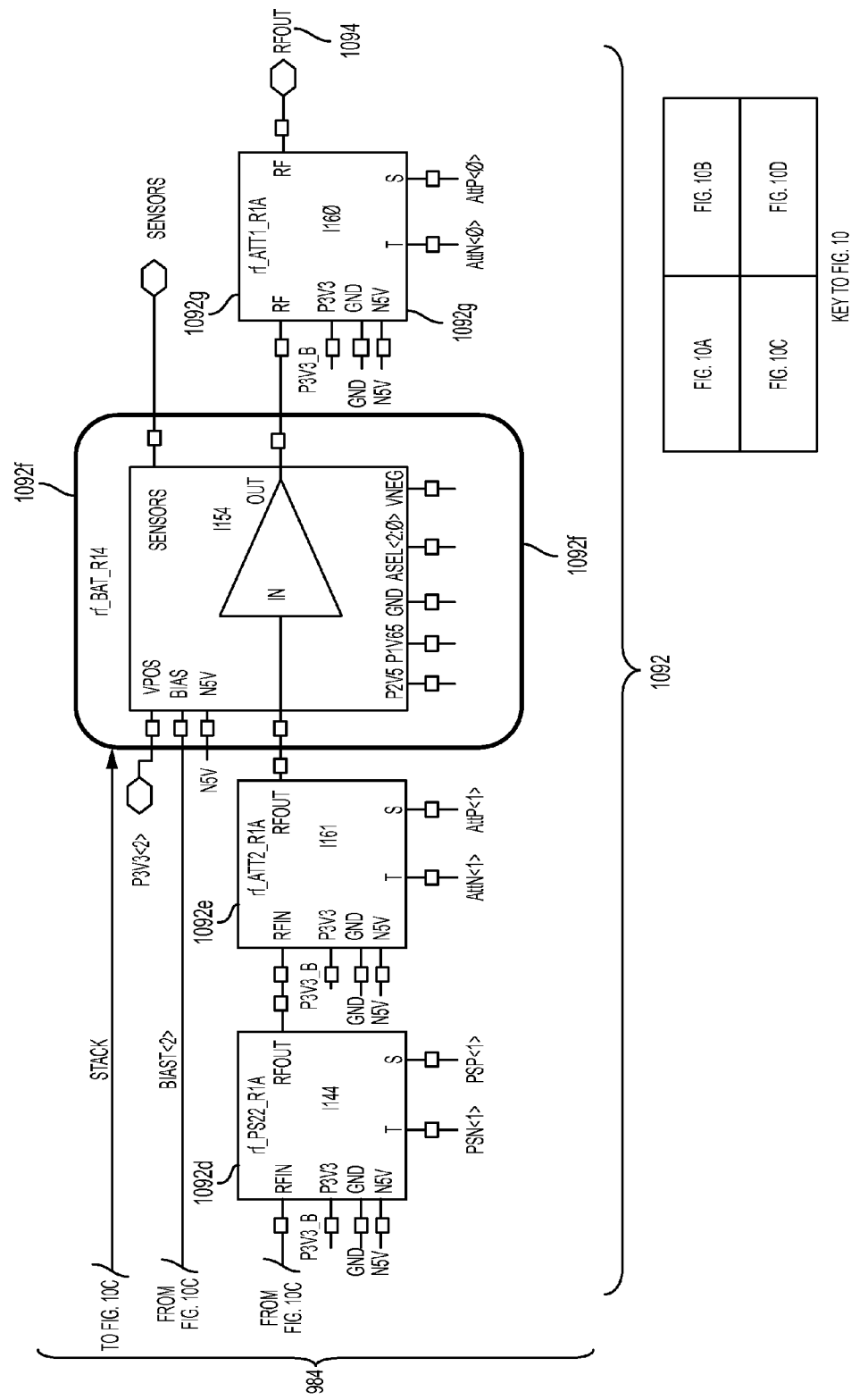

FIG. 9 illustrates an active circuits stacking diagram 900 in accordance with an embodiment of the disclosure. FIG. 9 illustrates a stacked circuits architecture approach which may be implemented in integrated circuit die 651 (shown in FIG. 6) as receive dual element circuit die 241 (as shown in FIG. 2D) or transmit dual element circuit die 242 (as shown in FIG. 2C). A stacked circuits architecture may be implemented within a plurality of substrate layers 984 including two or more substrate layers. FIG. 9 illustrates two substrate layers 985 and 986 included within substrate 984. However, in some embodiments, more substrate layers may be possible. In some embodiments, substrate 984 may be a high frequency silicon germanium alloy. However, other high frequency dielectric material such as complementary metal-oxide-semiconductor (CMOS) may be used.

A plurality of direct current consuming RF active circuits 981 may be integrated within the plurality of substrate layers (e.g., 985 and 986), wherein the sum of the direct current consumed by the plurality of direct current consuming RF active circuits 981 on each substrate layer is approximately equal. In some embodiments, current consuming RF active circuits 981 may be RF amplifiers. In other embodiments, RF mixers, active filters or other direct current consuming RF active circuits may be included.

A plurality of RF chokes 980 (e.g., RF inductive de-coupling circuits 980) may be integrated within substrate 984 and may be coupled between the plurality of RF amplifiers 981 and a plurality of direct current (DC) supply voltage connections 987. By separating DC from RF, each RF amplifier 981 may operate in a dc power supply domain appropriate to its device DC breakdown voltage. Direct currents may be established at the bottom of the stack (e.g., substrate layer 985). Direct currents travel in circuits in other substrate layers (e.g., substrate layer 986) in ratios defined by substrate layer 985 circuit topology. RF amplifier 981 direct current may be related to linearity in that direct current proportional to linear operation may be desired. Balancing the plurality of RF amplifiers 981 direct current within the plurality of substrate layers may be important to antenna subsystem 101 performance.

A plurality of test points 983 may be coupled to the plurality of RF amplifiers 981, wherein test points 983 may be configured to couple each amplifier direct current and DC voltage bias signals 982 to the monitor circuit 1104 (see FIG. 11) to provide feedback for RF amplifier 981 operational performance. In some embodiments, DC voltage bias signal 982 of each RF amplifier 981 is approximately 1.5 volts DC for silicon germanium substrate 984. However, DC voltage bias signal may be different magnitude for other types of substrate materials.

Stacking RF amplifiers 981 may replace low voltage, high current DC power supply requirements with high voltage, low current DC power supply requirements in antenna subsystem 101. It may also reduce the number of power supply interfaces needed in antenna subsystem 101. Separating DC signals from RF signals may allow for flexibility in the construction of antenna subsystem 101. RF amplifiers 981 may be arranged in an order that optimizes RF performance such as noise figure, DC power consumption and linearity. Utilization of multiple low gain dual element circuits 537 may have system advantages in linearity vs. power consumption as compared to fewer, higher gain, element circuits.

Figure 11:
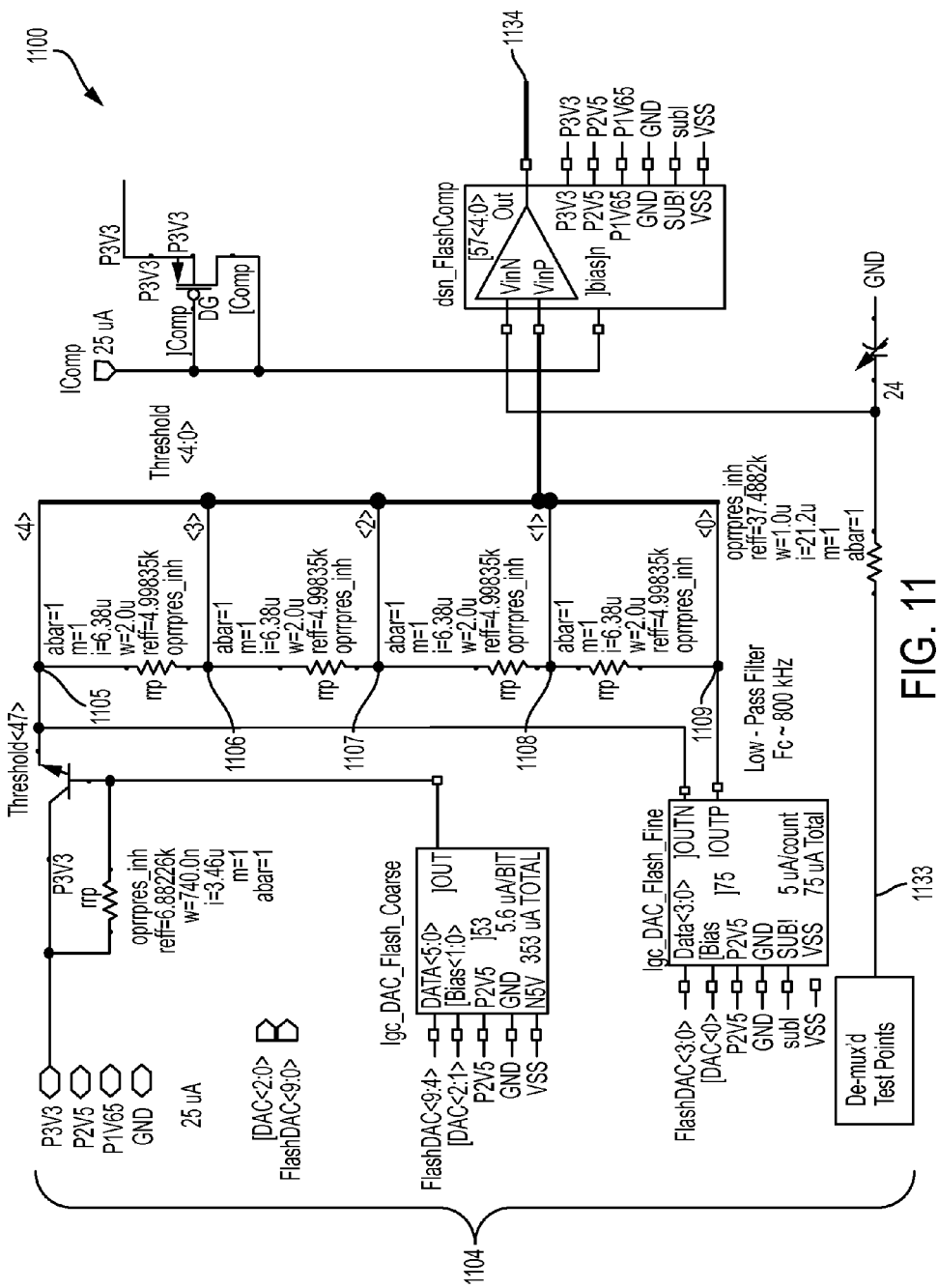
FIG. 11 illustrates a monitor circuit in accordance with an embodiment of the disclosure.

FIG. 10 illustrates a cascaded amplifier diagram 1000 in accordance with an embodiment of the disclosure. FIG. 10 includes a substrate 984 including a plurality of substrate layers (e.g., substrate layers 985, and 986), one or more input ports 1093 and output ports 1094, a plurality of amplification stages (e.g., amplification stages 1090, 1091, and 1092) including a plurality of amplifiers 647 (see FIG. 6), attenuators 649 (see FIG. 6), and phase shifters 650 (see FIG. 6). The plurality of amplifiers 647, attenuators 649, and phase shifters 650 may be integrated within the plurality of substrate layers 985 and 986. Amplification stages may be coupled between input port 1093 and output port 1094. One or more monitor circuits 1104 (as shown in FIG. 11) may be coupled to the plurality of amplification stages 1090, 1091, and 1092. The plurality of amplifiers 647 may be radio frequency (RF) amplifiers 647. The plurality of attenuators 649 may be RF attenuators 649 coupled to the plurality of amplifiers 647 and/or phase shifters 650. The plurality of phase shifters 650 may be RF phase shifters 650 coupled to the plurality of amplifiers 647 and/or attenuators 649.

Substrate 984 may be a high frequency silicon germanium alloy, wherein the plurality of RF amplifiers 647 may be cascaded therein. A first amplifier 1090*a* of a first amplification stage 1090 may be integrated within a first substrate layer 985 and a second amplifier 1090*c* of the first amplification stage 1090 may be integrated within a second substrate layer 986, wherein the first and second amplifiers (e.g., 1090*a* and 1090*c*) may be configured with operating bias settings selected to optimize an amplification, noise figure, and linearity of the first amplification stage 1090. The sum of the direct current consumed by the plurality of RF amplifiers 1090*a* and 1090*c* integrated within each substrate layer 985 and 986 may be approximately equal.

For example, three amplification stages (e.g., 1090, 1091 and 1092) of cascaded amplifier circuit 1000 are shown in FIG. 10. Amplification stage 1090 may include a first amplifier 1090*a* connected to RF input 1093 at an input port and connected to attenuator 1090*b* at an output port. Amplifier 1090*a* may be integrated within a first substrate layer 985 of substrate 984. Amplifier 1090*c* may be connected to attenuator 1090*b* at an input port and may be connected to phase shifter 1090*d* at an output port. Amplifier 1090*c* may be integrated within a second layer 986 of substrate 984.

By integrating amplifiers 1090*a* and 1090*c* on different substrate layers and setting amplifier 1090*a* operating bias, key antenna performance parameters such as noise figure and linearity may be controlled. Direct currents may be established by amplifiers integrated within the lowest most layer of substrate 984 (e.g., amplifier 1090*a* integrated within substrate layer 985). Subsequent substrate layers of amplifiers (e.g., 1090*c*) may consume a direct current approximately equal to the lowest most substrate layer current (e.g., substrate layer 985). In this regard, currents traveling through substrate 984 may be balanced. Balancing direct currents in RF amplifiers 981 may be an important contributor to maintaining linearity in antenna subsystem 101.

In another embodiment, amplification stage 1091 may be integrated within a first substrate layer 985. Amplification stage 1091 may include a first amplifier 1091*a* connected to phase shifter 1090*d* at an input port and connected to attenuator 1091*b* at an output port. Attenuator 1091*b* may be connected to phase shifter 1091*c*. Amplifier 1091*d* may be connected to phase shifter 1091*c* at an input port and connected to phase shifter 1091*e* at an output port.

In the same embodiment, amplification stage 1092 may be integrated within a second substrate layer 986. Attenuator 1092*a* may connect amplification stage 1092 to amplification stage 1091 at a connection with phase shifter 1091*e*. Amplification stage 1092 may include amplifier 1092*b* connected to attenuator 1092*a* at an input port and may be connected to phase shifter 1092*c* at an output port. Phase shifter 1092*c*, phase shifter 1092*d* and attenuator 1092*e* may be serially connected in this respective order. Amplifier 1092*f* may be connected to attenuator 1092*e* at an input port and may be connected to attenuator 1092*g* at an output port. Attenuator 1092*g* may be connected to cascaded amplifier circuit 1000 RF output port 1094. The direct current consumption of amplification stage 1092 (e.g., direct current consumption of amplifiers 1092*b* and 1092*f*) may be approximately equal to the direct current consumption of amplification stage 1091. In this regard, the direct current bias of each amplifier within an amplification stage may be controlled by inserting attenuation between amplifiers to optimize linearity of antenna subsystem 101. Further, integrating amplification stages within a silicon germanium alloy substrate provides for including attenuation and phase shifter components between amplifiers to reduce power consumption.

In some embodiments, each amplification stage 1090, 1091, and 1092 may be integrated within a separate layer of substrate 984. In other embodiments, one or more amplifiers of amplification stages 1090, 1091 and 1092 may be integrated within separate substrate layers of substrate 984. In some embodiments, one or more RF amplifiers 761 (see FIG. 7C) of selectable signal delay circuit 216 may be integrated on separate layers of substrate 538 (see FIG. 7A). In each embodiment, balancing direct currents between the separate substrate layers is an important contributor to linearity in antenna subsystem 101.

Integrating RF amplifiers 981 on multiple layers of a multi-layer substrate 984 may require monitoring DC bias currents and voltages to ensure each RF amplifier 981 operating bias is maintained in a safe operating range over process, temperature and input DC power supply variations. One or more monitor circuits 1104 may be coupled to the plurality of amplification stages (e.g., amplification stages 1090, 1091, and 1092). In this regard, test points 983 (see FIG. 9) may be coupled to each RF amplifier 981 to provide a direct current and direct voltage access. Test points 983 may be configured to connect each RF amplifier 981 direct current and voltage bias signals 982 (see FIG. 9) to a monitor circuit 1104.

FIG. 11 illustrates a monitor circuit 1100 in accordance with an embodiment of the disclosure. In FIG. 11, monitor circuit 1104 may be integrated within substrate 538 and/or integrated circuit die 651 that includes RF amplifiers 981 (e.g., RF amplifiers of dual element circuit die 537, selectable signal delay circuit 216, and distributed gain circuit 217) to monitor RF amplifier 981 direct current and voltage bias. In some embodiments, monitor circuit 1104 is implemented as a windowed flash analog to digital converter (ADC) integrated within integrated circuit die 651 and/or substrate 538. Monitor circuit 1104 may be configured to accept an input DC voltage range of approximately 1.4 to 1.6 volts DC at an input port 1133 and provide a digital signal with approximately 3 bits of resolution at an output port 1134. Monitor circuit 1104 may be configured to accept a corresponding one of a plurality of RF amplifiers 981 direct current and voltage bias signals from a plurality of test points 983 coupled to the corresponding one of a plurality of RF amplifiers 981.

A plurality of voltage references may be selected to overlap a safe operating range of RF amplifier 981. In some embodiments, five voltage references are used to compare to RF amplifier 981 direct current and/or voltage bias at input port 1133. Windowed flash ADC may include voltage references 1.6 volts (1105), 1.55 volts (1106), 1.5 volts (1107), 1.45 volts (1108) and 1.4 volts (1109). For example, an RF amplifier voltage present at input port 1133 outside the range 1.4 volts to 1.6 volts may be an indication RF amplifier 981 has exceeded the safe operating range. Other embodiments of windowed flash ADC voltage references may be possible where the safe operating range of RF amplifier 981 is different.

Monitoring may include providing RF amplifier 981 (e.g., amplifiers of dual element circuit die 537, selectable signal delay circuit 216, and distributed gain circuit 217) direct current and voltage bias over process, temperature, and input DC power supply variations as discussed herein. In this regard, monitor circuit 1104 may be necessary due to the low breakdown voltage (e.g., 1.5 volts) of high performance RF amplifiers integrated within silicon germanium substrates (e.g., substrates 538 and/or integrated circuit die 651).

FIGS. 12A and 12B illustrate gain and phase distortion plots of a dual element circuit 1200 in accordance with embodiments of the disclosure. Dual element circuit die 537 may include 1 RF input port and four RF output ports. Isolation of RF output ports to RF input port in dual element circuit die 537 (see. FIG. 6) may be limited by pad spacing constraints within integrated circuit die 651 due to the compact die topology and CTE mismatches as discussed herein. In this regard, impacts of various RF output to RF input feedback on element circuit gain and phase performance are presented in graphs 1240, 1241, 1242 and 1243.

Graphs 1240 and 1242 illustrate a gain and phase distortion simulated response to 70 dB of RF output signal to RF input signal isolation in a 30 dB RF gain circuit. Gain plot 1240 shows approximately 3 dB of gain distortion over a frequency range 29.25 GHz to 31.25 GHz. Phase plot 1242 shows approximately 5 degrees of phase distortion over frequency range 29.25 GHz to 31.25 GHz.

Graphs 1241 and 1243 illustrate a gain and phase distortion simulated response to 45 dB of RF output signal to RF input signal isolation in a 30 dB RF gain circuit. Gain plot 1241 shows approximately 6 dB of gain distortion over a frequency range 29.25 GHz to 31.25 GHz. Phase plot 1243 shows approximately 24 degrees of phase distortion over frequency range 29.25 GHz to 31.25 GHz. This results in an increase of approximately 3 dB of gain distortion and 19 degrees of phase distortion for the change in RF input to RF output isolation.

Graphs 1240/1242 and 1241/12433 illustrate sensitivity of pad spacing to RF performance in antenna subsystem 101. As antenna subsystem 101 becomes more compact and RF input to RF output pad spacing becomes more constrained, RF signal amplification in dual element circuit die 537 may need to be reduced. In this regard, RF signal amplification may need to be added elsewhere in antenna subsystem 101 to maintain antenna performance. Distributed gain circuit 217 may add an amplification to RF signals in receive sub-array tile assembly 211 and transmit sub-array tile assembly 214 to compensate for limited RF signal amplification in receive element circuit 213 and transmit element circuit 214, respectively. Adjustability of adding RF signal amplification may provide a low cost benefit to balance RF signal amplification in antenna subsystem 101 and maintain key performance parameters such as noise figure and linearity.

Figure 13:
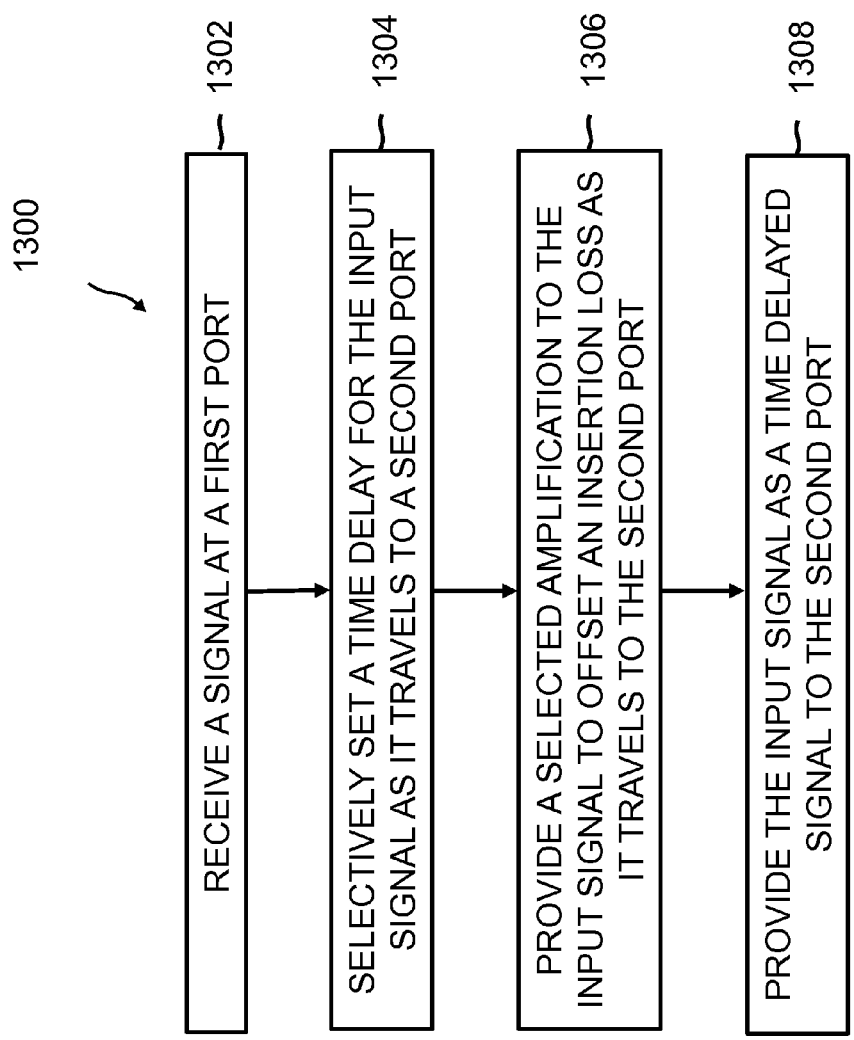
FIG. 13 illustrates a flow diagram describing a method for using a true time delay function in accordance with an embodiment of the disclosure.

FIG. 13 illustrates a flow diagram describing a method 1300 for using a true time delay function in accordance with an embodiment of the disclosure. The blocks or steps shown in method 1300 are not exhaustive and may include other steps and/or additional iterations of the blocks to implement true time delay function, as described herein.

Prior to beginning method 1300, a selectable signal delay circuit 216 may be provided. In this regard, selectable signal delay circuit 216 includes a plurality of delay lines 757 (e.g., lumped element delay lines) and an input port 763 and an output port 764, wherein the delay lines 757 may be disposed between input port 763 and output port 764. A plurality of amplifiers 761 may be coupled to corresponding ones of the plurality of delay lines 757 and may be coupled between input port 763 and output port 764. A plurality of switches 762 may be configured to selectively couple the plurality of delay lines 757 and corresponding amplifiers 761 to provide a selectable delay and amplification between input port 763 and output port 764.

Selectable signal delay circuit 216 may be integrated within a substrate 538. Further, substrate 538 may be coupled to a circuit board 539 wherein selectable signal delay circuit 216 may be coupled to a plurality of receive element circuits 213.

Method 1300 may begin in block 1302 by receiving a signal at a first port. Receiving a signal at a first port 763 may include receiving a plurality of RF signals 221 (e.g., RF signals 221a or 221b) from a plurality of antenna elements 536 at a plurality of receive element circuits 213 input ports and amplifying and phase shifting the plurality of RF signals 221 at a plurality of receive element circuits 213 output ports 226a or 226b.

Receiving a signal at a first port may further include combining a plurality of receive element circuits 213 output ports 226a or 226b RF signals to form a combined RF signal at the first port 763. It will be appreciated receive element circuit 213 may form part of receive dual element circuit die 241. In this regard, receive dual element circuit die 241 may comprise two receive element circuits 213. Each receive element circuit 213 may provide an RF signal at output port 226a or 226b to one of two sub-array combiner circuits 218a and 218b wherein thirty-two RF signals corresponding to thirty-two receive element circuit 213 output signals 226a or 226b may be combined into combined RF signal 331a or 331b. Each combined output signal (e.g., combined RF signal 331a or 331b) may be coupled to a corresponding one of two substrates 538 wherein substrate 538 may include distributed gain circuit 217 and selectable signal delay circuit 216 as described herein. Distributed gain circuit 217 may include an amplification stage that amplifies combined RF signal 331a or 331b and may provide an amplified combined RF signal at selectable signal delay circuit input port 763.

After receiving a signal at a first port 763, block 1304 may continue process 1300 by selectively setting a time delay for the input signal as it travels to a second port 764. The selectively setting the time delay may comprise receiving a control signal 230 for selecting a one of a plurality of time delays for the input signal traveling between input port 763 and output port 764. In some embodiments, control signal 230 may select one or more of a plurality of radio frequency (RF) switches 762 coupled to one or more delay lines 757 adapted as eight wavelength 758, four wavelength 759 and two wavelength 760 delays, wherein delay lines 757 may be of uniform length and configured to match an insertion loss of switch 762. The desired time delay may be selectable from 0 to 14 wavelengths in increments of 2 wavelengths by controlling one or more RF switches 762.

After selectively setting a time delay for the input signal as it travels to a second port 764, block 1306 may continue process 1300 by providing a selected amplification to the input signal to offset an insertion loss as it travels to the second port 764. The providing a selected amplification to the input signal may include providing an amplification to offset an insertion loss of the one or more delay lines 757 and the one or more switches 762 to make an amplification of the signal at the output port 764 approximately equal to an amplification of the signal at the input port 763. A plurality of RF amplifiers 761 may be coupled to the plurality of delay lines 757 such that an amplification of a corresponding one or more RF amplifiers 761 coupled to corresponding one of delay lines 758, 759 and 760 may be predetermined to offset an insertion loss of the corresponding delay line (e.g., delay line 758, 759 or 760) plus RF switch 762 coupled to the corresponding delay line. In this regard, amplification of RF signal at output port 764 may be approximately equal to amplification of RF signal at input port 763.

After providing a selected amplification to the input signal to offset an insertion loss as it travels to the second port 764, block 1308 may continue process 1300 by providing the input signal as a time delayed signal to the second port 764. After amplified combined RF signal is selectively delayed, selectable signal delay circuit 216 may provide a coherent RF signal to an antenna subsystem 101 at output port 764.

Figure 14:
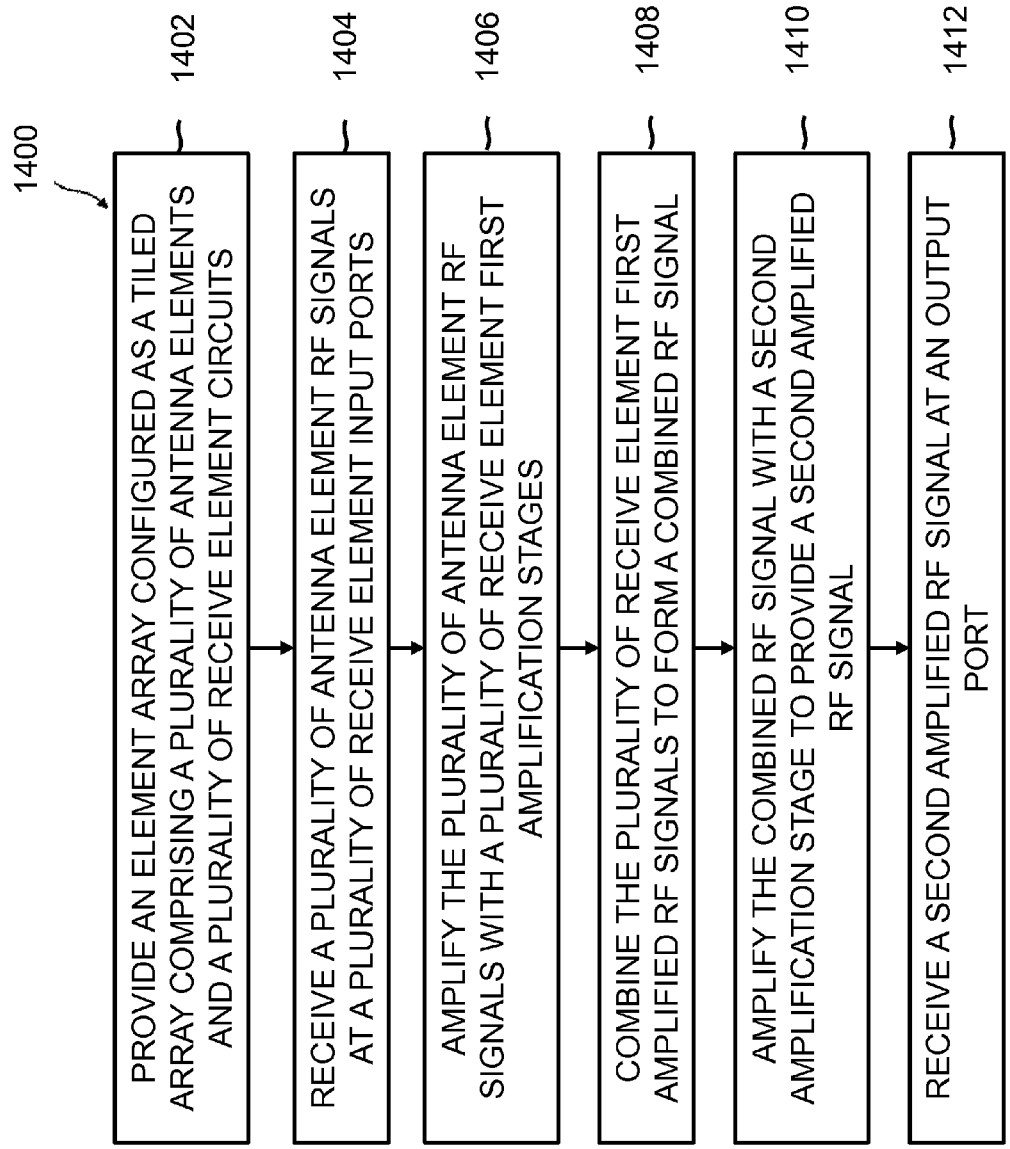
FIG. 14 illustrates a flow diagram describing a method for using a distributed gain function in accordance with an embodiment of the disclosure.

FIG. 14 illustrates a flow diagram describing a method 1400 for using a distributed gain function in accordance with an embodiment of the disclosure. The blocks or steps shown in method 1400 are not exhaustive and may include other steps and/or additional iterations of the blocks to implement distributed gain function, as described herein.

Method 1400 may begin in block 1402 by providing an element array configured as a tiled array comprising a plurality of antenna elements 536 and a plurality of receive element circuits 213. In this regard, element array may be configured as receive sub-array tile assembly 211. Receive sub-array tile assembly 211 may include sixty-four antenna elements 536 and sixty-four receive element circuits 213 (e.g., thirty-two receive dual element circuit die 241), integrated within a circuit board 539. Further, receive sub-array tile assembly 211 may include two substrates 538, wherein each substrate 538 may be coupled to circuit board 539. A distributed gain circuit 217 and selectable signal delay circuit 216 may be integrated within each substrate 538, wherein each and distributed gain circuit 217 may be coupled to a corresponding thirty-two of sixty-four receive element circuits 213.

After providing an element array configured as a tiled array comprising a plurality of antenna elements 536 and a plurality of receive element circuits 213, block 1404 may continue process 1400 by receiving a plurality of antenna element RF signals at a plurality of receive element input ports. Each receive element circuit 213 may be configured to receive a corresponding one of sixty-four RF signals from a corresponding sixty-four antenna elements 536.

After receiving a plurality of antenna element RF signals at a plurality of receive element input ports, block 1406 may continue process 1400 by amplifying the plurality of antenna element RF signals with a plurality of receive element first amplification stages. Each receive element circuit 213 may be configured to provide a first amplification and phase shift to an RF input signal. Amplifying the plurality of antenna element RF signals with a plurality of first amplification stages may comprise providing an amplification that is limited by effects of coupling between an input port and an output port. In this regard, CTE mismatches may limit spacing between die pads putting input and output port die pads in close proximity. Close proximity of input and output die pads result in output port to input port coupling. First amplification of RF signal may be limited to minimize output to input coupling wherein coupling may degrade antenna subsystem 101 key performance parameters such as noise figure and linearity.

After amplifying the plurality of antenna element RF signals with a plurality of receive element first amplification stages, block 1408 may continue process 1400 by combining the plurality of receive element first amplified RF signals to form a combined RF signal. A first thirty-two receive element circuit output signals 226*a* may be received at a sub-array combiner circuit 218*a* input to combine the first thirty-two RF signals to form combined RF signal 331*a* (see FIG. 3). A second thirty-two receive element circuit output signals 226*b* may be received at a sub-array combiner circuit 218*b* input to combine the second thirty-two RF signals to form combined RF signal 331*b* (see FIG. 3).

After combining the plurality of receive element first amplified RF signals to form a combined RF signal, block 1410 may continue process 1400 by amplifying the combined RF signal with a second amplification stage to provide a second amplified RF signal. The amplifying the combined RF signal with a second amplification stage comprises amplifying the thirty-two combined first amplified RF signals wherein signal amplification is boosted in the traveling RF signal. In this regard, a first distributed gain circuit 217 may be coupled to corresponding first combined RF signal 331*a* to provide a second amplification. A second distributed gain circuit 217 may be coupled to corresponding second combined RF signal 331*b* to provide a second amplification. Distributed gain circuit 217 provides an amplification to maintain signal fidelity of combined RF signal as RF signal travels through lossy distribution networks and improve noise figure of antenna subsystem 101.

After amplifying the combined RF signal with a second amplification stage to provide a second amplified RF signal, block 1412 may continue process 1400 by receiving a second amplified RF signal at an output port. Second amplified RF signal may travel from distributed gain circuit 217 output port to selectable signal delay circuit 216 input port 763. Selectable signal delay circuit 216 may provide a selectable delay of second amplified RF signal. Selection of location of distributed gain circuit 217 in RF signal flow 210 provides for a balanced amplification in antenna subsystem 101. Distributed gain circuit 217 supplements the plurality of receive element circuits 213 amplification to maintain signal fidelity and improve noise figure and linearity of antenna subsystem 101.

In some embodiments, element array may be configured as transmit sub-array tile assembly 212. Transmit sub-array tile assembly 212 may include sixty-four antenna elements 536 and sixty-four transmit element circuits 214 (e.g., thirty-two transmit dual element circuit die 242), integrated within circuit board 539. Further, transmit sub-array tile assembly 212 may include one substrate 538, wherein substrate 538 may be coupled to circuit board 539. A distributed gain circuit 217 may be integrated within substrate 538, wherein distributed gain circuit 217 may be coupled to a corresponding sixty-four transmit element circuits 214.

A method 1400 for using a distributed gain function for transmit sub-array tile assembly 212 may include receiving an RF signal an input port 223, amplifying the RF signal with a first amplification stage 217 (e.g., distributed gain circuit 217), dividing the first amplified RF signal into a plurality of first amplified RF signals (e.g., using sub-array splitter circuit 219), amplifying the plurality of first amplified signals with a plurality of second amplification stages to provide a second amplified RF signal (e.g., using a plurality of transmit element circuits 214), and receiving a plurality of second amplified RF signals at a plurality of output ports (e.g., a plurality of output ports 225*a* and 225*b*).

Figure 15:
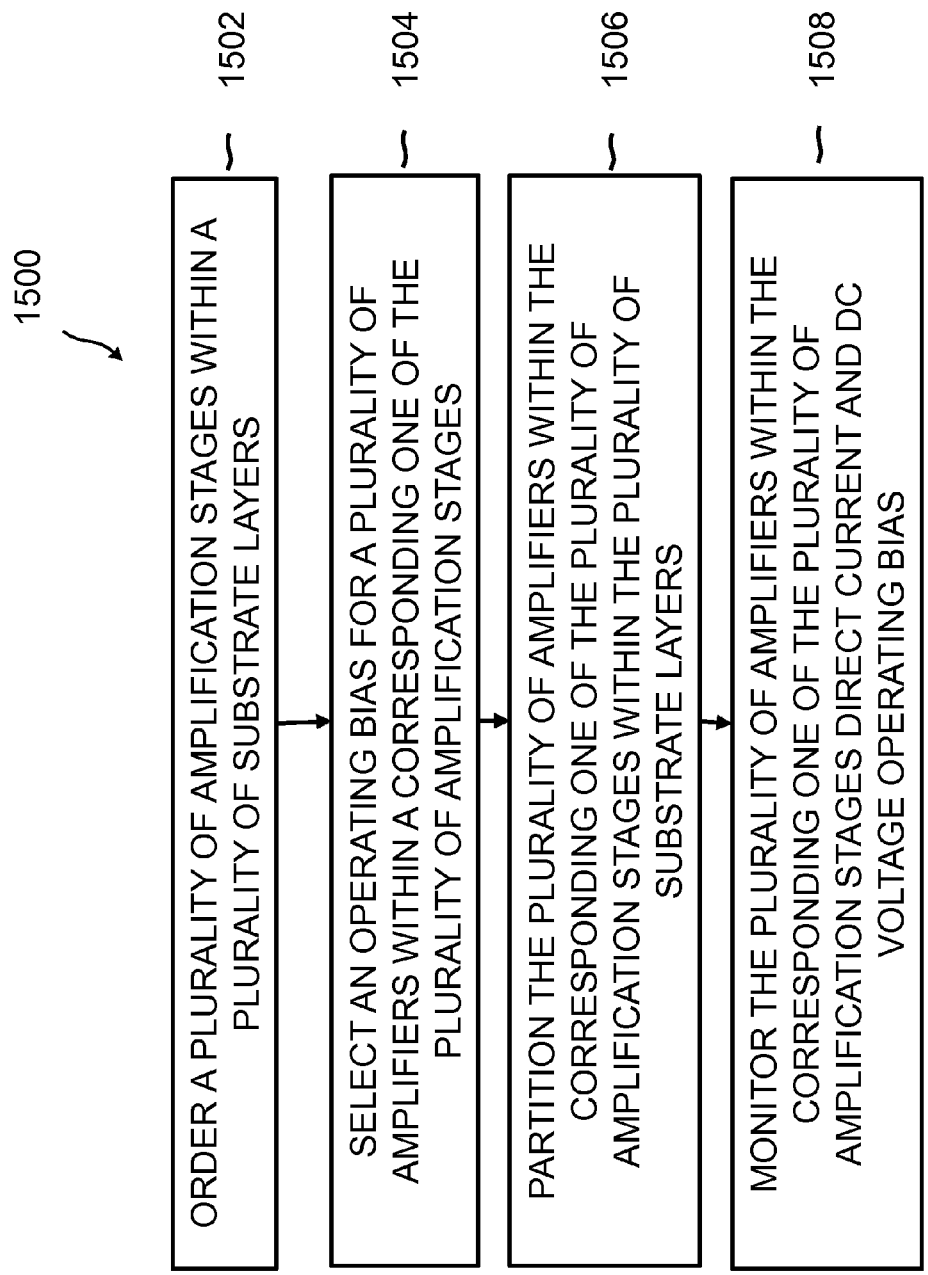
FIG. 15 illustrates a flow diagram describing a method for making a stacked amplifier configuration in accordance with an embodiment of the disclosure.

FIG. 15 illustrates a flow diagram describing a method 1500 for making a stacked amplifier configuration in accordance with an embodiment of the disclosure. The blocks or steps shown in method 1500 are not exhaustive and may include other steps and/or additional iterations of the blocks to implement stacked amplifier configuration, as described herein.

Prior to beginning method 1500, a substrate 984 may be provided. Substrate 984 may include a plurality of substrate layers (e.g., substrate layers 985 and 986), one or more input ports 1093 and output ports 1094, and a plurality of amplification stages (e.g., amplification stages 1090, 1091, and 1092). Amplification stages 1090, 1091, and 1092 may include a plurality of amplifiers (e.g., similar to amplifier 1090*a*), attenuators (e.g., similar to attenuator 1090*b*), and phase shifters (e.g., similar to phase shifter 1090*d*) integrated within the plurality of substrate layers 985 and 986. The amplification stages 1090, 1091, and 1092 may be coupled between the input 1093 and output 1094 ports. One or more monitor circuits 1104 may be coupled to the plurality of amplification stages 1090, 1091, and 1092.

Method 1500 may begin in block 1502 by ordering a plurality of amplification stages (e.g., amplification stages 1090, 1091, and 1092) within a plurality of substrate layers (e.g., substrate layers 985 and 986). The ordering of the plurality of amplification stages 1090, 1091, and 1092 may comprise arranging the amplifiers (e.g., similar to amplifier 1090*a*) to optimize an amplification, noise figure, and linearity of the amplification stage, wherein the amplification of antenna subsystem 101 is divided among the plurality of amplification stages 1090, 1091, and 1092.

After ordering a plurality of amplification stages (e.g., amplification stages 1090, 1091, and 1092) within a plurality of substrate layers (e.g., substrate layers 985 and 986), block 1504 may continue process 1500 by selecting an operating bias for a plurality of amplifiers (e.g., similar to amplifier

1090*a*) within a corresponding one of the plurality of amplification stages 1090, 1091, and 1092. The selecting an operating bias for the plurality of amplifiers may comprise setting each amplifier operating bias, wherein the amplification stage output signal is approximately linear. Setting the operating bias of each amplifier within a linear operating range may ensure reliable and efficient amplifier operation and reduce power consumption. Reduced power consumption may be important for thermal management of sixty-four element sub-array tile assembly 535.

After selecting an operating bias for a plurality of amplifiers (e.g., similar to amplifier 1090*a*) within a corresponding one of the plurality of amplification stages 1090, 1091, and 1092, block 1506 may continue process 1500 by partitioning the plurality of amplifiers within the corresponding one of the plurality of amplification stages 1090, 1091, and 1092 within the plurality of substrate layers 985 and 986. The partitioning the plurality of amplifiers (e.g., amplifier 1090*a*) of each amplification stage 1090, 1091, and 1092 may comprise arranging the plurality of amplifiers within the plurality of substrate layers 985 and 986, wherein the sum of the direct current consumed on each substrate layer 985 and 986 is approximately equal.

After partitioning the plurality of amplifiers within the corresponding one of the plurality of amplification stages 1090, 1091, and 1092 within the plurality of substrate layers 985 and 986, block 1508 may continue process 1500 by monitoring the plurality of amplifiers (e.g., amplifier 1090*a*) within the corresponding one of the plurality of amplification stages 1090, 1091 and 1092 direct current and DC voltage operating bias. The monitoring may include receiving amplifier direct current and DC voltage operating bias from a plurality of test points 983 coupled to each amplifier (amplifier 1090*a* for example). Further, the monitoring may comprise providing the amplifier direct current and DC voltage bias over a range of process, temperature, and in DC power supply variations. Monitoring amplifier operating bias may ensure amplifier is maintained in a safe operating range for reliable and efficient operation.

Embodiments described above illustrate but do not limit the invention. For example, it will be appreciated that, where appropriate, principles applied herein to phased array antenna subsystems used in communication systems can be applied to phased array antenna subsystems used in radar systems or other high frequency RF systems. As a specific example, the technical disclosure in FIG. 7 (true time delay), FIG. 8 (distributed gain), and FIG. 9 (active RF circuits stacking) may each be implemented in various applications and are not limited to that disclosed herein, such as FIG. 1 (communications system). It should also be understood that numerous modifications and variations are possible in accordance with the principles of the present invention. Accordingly, the scope of the invention is defined only by the following claims.

What is claimed is:

1. A system comprising:
a substrate comprising a plurality of substrate layers;
one or more input ports and output ports;
a plurality of amplification stages comprising a plurality of amplifiers, attenuators, and phase shifters integrated within the plurality of substrate layers, the amplification stages coupled between the input and output ports, wherein:
a sum of a direct current consumed by the plurality of amplifiers integrated within each substrate layer is approximately equal;
the plurality of amplifiers are radio frequency (RF) amplifiers;
the plurality of attenuators are RF attenuators coupled to the plurality of amplifiers and/or phase shifters; and
the plurality of phase shifters are RF phase shifters coupled to the plurality of amplifiers and/or attenuators; and
one or more monitor circuits coupled to the plurality of amplification stages.

2. The system of claim 1, wherein:
a first amplifier of a first amplification stage is integrated within a first substrate layer;
a second amplifier of the first amplification stage is integrated within a second substrate layer; and
wherein the first and second amplifiers are configured to have operating bias settings selected to optimize an amplification, noise figure, and linearity of the first amplification stage.

3. The system of claim 1, further comprising:
a plurality of RF inductive de-coupling circuits integrated within the substrate coupled between the plurality of amplifiers and a plurality of direct current (DC) connections, wherein the sum of the direct current consumed by the plurality of amplifiers, attenuators, and phase shifters on each substrate layer is approximately equal.

4. The system of claim 1, further comprising:
a plurality of test points coupled to the plurality of amplifiers, wherein the test points are configured to couple each amplifier direct current and DC voltage bias signals to the monitor circuit; and
wherein the DC voltage bias signal of each amplifier is approximately 1.5 volts DC.

5. The system of claim 1, wherein:
the monitor circuit is integrated with the substrate and implemented as a windowed flash analog to digital converter (ADC) configured to accept an input DC voltage range of approximately 1.4 to 1.6 volts DC at an input port and provide a digital signal with approximately 3 bits of resolution at an output port.

6. A method of using the system of claim 1, the method comprising:
selecting an operating bias for the plurality of amplifiers within a corresponding one of the plurality of amplification stages to optimize an amplification, noise figure, and linearity of the amplification stage;
partitioning the plurality of amplifiers within the corresponding one of the plurality of amplification stages within the plurality of substrate layers, wherein the sum of the direct current consumed by the plurality of amplifiers integrated within each substrate layer is approximately equal; and
monitoring with the monitor circuit coupled to a plurality of amplifier test points, the amplifier direct current and DC voltage operating bias.

7. A method comprising:
ordering a plurality of amplification stages within a plurality of substrate layers, wherein the ordering comprises arranging the amplification stages to optimize an amplification, noise figure, and linearity of the amplification stage;
selecting an operating bias for a plurality of amplifiers within a corresponding one of the plurality of amplification stages;

partitioning the plurality of amplifiers within the corresponding one of the plurality of amplification stages within the plurality of substrate layers;
monitoring the plurality of amplifiers within the corresponding one of the plurality of amplification stages direct current and DC voltage operating bias; and
wherein the amplification of an antenna subsystem is divided among the plurality of amplification stages.

8. The method of claim 7, wherein:
the selecting the operating bias for the plurality of amplifiers within the substrate layers comprises setting each amplifier operating bias within a linear range, and balancing the direct currents between the substrate layers to maintain the amplification stage output signal is approximately linear.

9. The method of claim 7, wherein:
the partitioning the plurality of amplifiers of each amplification stage comprises arranging the plurality of amplifiers within the plurality of substrate layers, wherein the sum of the direct current consumed on each substrate layer is approximately equal.

10. The method of claim 7, the monitoring further comprising:
receiving, by a plurality of test points coupled to the plurality of amplifiers and the monitor circuit, the amplifier direct current and DC voltage bias signals, wherein the DC voltage bias signal of each amplifier is approximately 1.5 volts DC.

11. The method of claim 7, wherein:
the monitoring comprises accepting the amplifier direct current and DC voltage bias over a range of process, temperature, and power supply variations at an input port of a windowed flash analog to digital converter and providing a digital signal with approximately three bits of resolution at an output port.

12. A system comprising:
an element array comprising:
  a substantially planar circuit board;
  a plurality of antenna elements integrated in the circuit board;
  a plurality of receive element circuits coupled to the circuit board wherein each receive element circuit is coupled to a corresponding one of the plurality of antenna elements to receive an RF signal at an input port and configured to provide an amplification and phase shift to the RF signal;
  a plurality of combiner circuits integrated in the circuit board and coupled to the plurality of receive element circuits, adapted to combine the plurality of amplified and phase shifted RF signals to form a combined RF signal; and
  one or more substrates, each of the substrates comprising:
    a distributed gain circuit coupled to the plurality of combiner circuits to receive the combined RF signal at an input port and configured to provide an amplification to the combined RF signal; and
    a selectable signal delay circuit coupled to the distributed gain circuit to receive the amplified combined RF signal at an input port and configured to provide a delay to the amplified combined RF signal at an output port; and
    a connector coupled to each of the one or more substrates selectable signal delay circuit output ports.

13. The system of claim 12, wherein:
the receive element circuit further comprises:
a silicon germanium substrate comprising a plurality of substrate layers;
one or more input ports and output ports;
a plurality of amplification stages comprising a plurality of amplifiers, attenuators, and phase shifters integrated within the plurality of substrate layers, coupled between the input and output ports; and
one or more monitor circuits coupled to the plurality of amplification stages.

14. The system of claim 13, wherein:
a first amplifier of a first amplification stage is integrated within a first substrate layer;
a second amplifier of a first amplification stage is integrated within a second substrate layer; and
wherein the first and second amplifiers operating bias settings are selected to optimize an amplification, noise figure, and linearity of the first amplification stage.

15. The system of claim 13, further comprising:
RF inductive de-coupling circuits integrated within the substrate coupled between the plurality of amplifiers and a plurality of DC connections.

16. The system of claim 12, further comprising:
an RF input signal;
the distributed gain circuit configured to receive the RF input signal and provide an amplification to the RF input signal;
a plurality of splitter circuits integrated with the circuit board and coupled to the distributed gain circuit, adapted to divide the amplified RF input signal to form a plurality of amplified RF signals;
a plurality of transmit element circuits coupled to the circuit board wherein each transmit element circuit is coupled to the plurality of splitter circuits to receive a corresponding one of the plurality of amplified RF signals at an input port and adapted to provide an amplification and phase shift to the RF signal, wherein the amplified and phase shifted RF signal is configured as two branch line coupled signals at the transmit element circuit output port; and
a plurality of antenna elements integrated on the circuit board coupled to the plurality of transmit element circuit output ports.

17. The system of claim 16, wherein:
the transmit element circuit further comprises:
a silicon germanium substrate comprising a plurality of substrate layers;
one or more input ports and output ports;
a plurality of amplification stages comprising a plurality of amplifiers, attenuators and phase shifters integrated within the plurality of substrate layers, coupled between the input and output ports;
one or more monitor circuits coupled to the plurality of amplification stages; and
RF inductive de-coupling circuits integrated within the substrate coupled between the plurality of amplifiers and a plurality of DC connections.

18. The system of claim 17, wherein:
a first amplifier of a first amplification stage is integrated within a first substrate layer;
a second amplifier of a first amplification stage is integrated within a second substrate layer; and
  wherein the first and second amplifiers operating bias settings are selected to optimize an amplification, noise figure, and linearity of the first amplification stage.

* * * * *